US006941649B2

(12) United States Patent
Goergen

(10) Patent No.: US 6,941,649 B2
(45) Date of Patent: Sep. 13, 2005

(54) METHOD OF FABRICATING A HIGH-LAYER-COUNT BACKPLANE

(75) Inventor: Joel R. Goergen, Maple Grove, MN (US)

(73) Assignee: Force10 Networks, Inc., Milpitas, CA (US)

( * ) Notice: Subject to any disclaimer, the term of this patent is extended or adjusted under 35 U.S.C. 154(b) by 264 days.

(21) Appl. No.: 10/068,745

(22) Filed: Feb. 5, 2002

(65) Prior Publication Data

US 2003/0177638 A1 Sep. 25, 2003

(51) Int. Cl.[7] .................................................. H05K 3/02

(52) U.S. Cl. ............................ 29/846; 29/831; 29/850; 29/852; 174/258; 361/780

(58) Field of Search .................. 29/830, 831, 846–852; 174/250, 255, 256, 258; 257/691–700, 728; 361/780, 784, 795; 438/18

(56) References Cited

U.S. PATENT DOCUMENTS

| | | | | |
|---|---|---|---|---|
| 4,694,123 A | | 9/1987 | Massey | |
| 4,771,366 A | * | 9/1988 | Blake et al. | 361/705 |
| 4,862,161 A | | 8/1989 | Schomers | |
| 4,891,616 A | | 1/1990 | Renken et al. | |
| 5,010,641 A | | 4/1991 | Sisler | |
| 5,261,153 A | | 11/1993 | Lucas | |
| 5,308,926 A | | 5/1994 | Auerbuch et al. | |
| 5,311,406 A | | 5/1994 | Snodgrass | |
| 5,397,861 A | * | 3/1995 | Urquhart, II | 174/250 |
| 5,548,734 A | | 8/1996 | Kolinski et al. | |
| 5,566,083 A | | 10/1996 | Fang | |
| 5,659,951 A | * | 8/1997 | Gall et al. | 29/830 |
| 5,682,298 A | | 10/1997 | Raynham | |
| 5,691,209 A | | 11/1997 | Liberkowski | |
| 5,743,004 A | * | 4/1998 | Chobot et al. | 29/830 |
| 5,841,074 A | | 11/1998 | Egan | |
| 5,870,274 A | | 2/1999 | Lucas | |
| 6,015,300 A | | 1/2000 | Schmidt, Jr. et al. | |

(Continued)

FOREIGN PATENT DOCUMENTS

| | | |
|---|---|---|
| EP | 0594200 A2 | 4/1994 |
| EP | 1143761 A2 | 10/2001 |
| JP | 2001102755 | 4/2001 |
| WO | 00 78105 | 12/2000 |

OTHER PUBLICATIONS

Markstein, H.W.: "Ensuring Signal Integrity in Connectors, Cables, and Backplanes," Electronic Packaging and Production; vol. 36, No. 11; Oct. 1, 1996, pp. 61–69.

(Continued)

*Primary Examiner*—Minh Trinh
*Assistant Examiner*—Donghai D. Nguyen
(74) *Attorney, Agent, or Firm*—Haynes and Boone, LLP

(57) ABSTRACT

The disclosed board fabrication techniques and design features enable the construction of a reliable, high-layer-count, and economical backplane for routers and the like that require a large number of signaling paths across the backplane at speeds of 2.5 Gbps or greater, as well as distribution of significant amounts of power to router components. The disclosed techniques and features allow relatively thick (e.g., three- or four-ounce copper) power distribution planes to be combined with large numbers of high-speed signaling layers in a common backplane. Using traditional techniques, such a construction would not be possible because of the number of layers required and the thickness of the power distribution layers. The disclosed embodiments use novel layer arrangements, material selection, processing techniques, and panel features to produce the desired high-speed layers and low-noise high-power distribution layers in a single mechanically stable board.

10 Claims, 18 Drawing Sheets

U.S. PATENT DOCUMENTS

| | | | | | |
|---|---|---|---|---|---|
| 6,030,693 | A | | 2/2000 | Boyko | |
| 6,081,430 | A | | 6/2000 | La Rue | |
| 6,091,609 | A | | 7/2000 | Hutson et al. | |
| 6,181,004 | B1 | * | 1/2001 | Koontz et al. | 438/18 |
| 6,229,095 | B1 | | 5/2001 | Kobayashi | |
| 6,333,981 | B1 | | 12/2001 | Weir et al. | |
| 6,407,341 | B1 | * | 6/2002 | Anstrom et al. | 29/846 |
| 6,630,627 | B1 | | 10/2003 | Tobita | |
| 6,751,699 | B1 | | 6/2004 | Langley, Sr. et al. | 710/317 |
| 2002/0060366 | A1 | | 5/2002 | Kikuchi et al. | |

OTHER PUBLICATIONS

Scaminaci, J: "Avoiding Signal Integrity Problems in Backplanes," Electronic Packaging and Production; vol. 34, No. 7; Jul. 1, 1994, pp. 40–44.

Markstein, H.W.: "Impedances Dictate Backplanes," Electronic Design, Packaging and Production; vol. 33, No. 12; Dec. 1, 1993, pp. 38–40.

Teradyne: Web ProForum Tutorial; *Design Considerations for Gigabit Backplane Systems Tutorial* printed on Nov. 6, 2000 from website located at www.iec.org/tutorials/design_backplane/; pp. 1–43.

Teradyne: VHDM Home Page; *Backplane Assemblies and Connectors* printed on Nov. 6, 2000 from website located at www.teadryne.com/prods/bps/vhdm/intro.html; pp. 1–3.

Teradyne: Products; *Backplanes* printed on Nov. 6, 2000 from website located at www.teradyne.com/prods/bps/vhdm/intro.html; pp. 1–2.

Teradyne: VHDM Home Page; *VHDM High–Speed Differential* printed on Nov. 6, 2000 from website located at www.teradyne.com/prods/bps/vhdm/intro.html; pp. 1–3.

Teradyne: Virtual Exhibits; *Total Interconnect Solutions* printed on Nov. 6, 2000 from website located at www.iec.org/exhibits/teradyne_02/; pp. 1–5.

Cahners EDN Access; *New printed–wiring–board materials guard against garbled gigabits* printed on Nov. 6, 2000 from website located at www.ednmag.com/ednmag/reg/1999/111199/23ms593.htm; pp. 1–5.

PARKnelco; *N4000–6 Overview* and product description; pp. 1–2.

PARKnelco; *N6000* and *N6000SI Overview* and product description; pp. 1–2.

PARKnelco; *N7000–2 HT Laminate* and *N7000–3 Prepeg Overview* and product description; pp. 1–2.

PARKnelco; *N8000 Overview* and product description; pp. 1–2.

Origninal Submission Request for Non–Publication–Rescinded Ser. No. 10/068,745; dated Jul. 31, 2002; 1 page.

Origninal Submission Request for Non–Publication–Rescinded Ser. No. 10/068,616; dated Jul. 31, 2002; 1 page.

Corrected filing receipt for '616 application; dated Sep. 9, 2002; 2 pages.

Resubmission copies of Request for Non–Publication–Rescinded and coversheet Ser. No. 10/068,745; dated Jun. 13, 2003; 2 pages.

Notice Regarding Rescission Ser. No. 10/068,745; dated Jun. 13, 2003; 1 page.

Notice of Publication Ser. No. 10/068,745; dated Sep. 25, 2003; 1 page.

Johnson and Graham; "*High–Speed Digital Design, A Handbook of Black Magic*"; 1993; pp. 257–262.

* cited by examiner

METHOD OF FABRICATING A HIGH-LAYER-COUNT BACKPLANE

FIELD OF THE INVENTION

This invention relates generally to high-layer-count circuit board fabrication, and more specifically to methods for constructing backplane wiring systems for highly interconnected, high-speed modular digital communications systems such as routers and switches.

BACKGROUND OF THE INVENTION

A backplane generally comprises a printed circuit board having a number of card connection slots or bays. Each slot or bay comprises, e.g., one or more modular signal connectors or card edge connectors, mounted on the backplane. A removable circuit board or "card" can be plugged into the connector(s) of each slot. Each removable circuit board contains drivers and receivers necessary to communicate signals across the backplane with corresponding drivers and receivers on other removable circuit boards.

One or more layers of conductive traces are formed on and/or in the backplane. The traces connect to individual signal connection points at the various slots to form data lines and control lines.

Router backplanes present a challenging area of circuit board design (for convenience, routers and switches will be referred to herein collectively as "routers", as the technical distinctions between the two are unimportant to the invention as described herein). By their very nature, configurable modular routers require a high degree of interconnectivity between their removable router cards. With any appreciable number of cards, it becomes infeasible to build large parallel point-to-point connection buses between each pairing of the cards. This limitation hinders further growth in large router throughput, as the next generation of large routers may well see throughput requirements measured in terabits-per-second. As such throughput requirements may require several tens (or even hundreds) of logical ports to exchange data simultaneously at twenty to one-hundred Gigabit-per-second (Gbps) speeds, it can be appreciated that the connectivity and throughput requirements placed on large router backplanes are extreme.

Many router manufacturers, believing that the limits of electrical circuit boards have been reached in the area of large router backplanes, are now designing optical backplanes for their next-generation products. Optical backplanes avoid some of the most problematic characteristics of electrical backplanes, such as trace density, signal attenuation, signal reflection, radiated noise, crosstalk, and manufacturing limitations-characteristics that become increasingly significant as single-trace signaling speeds push into the multi-Gbps range. Optical backplanes, however, come with their own set of problems, chief among these being cost and complexity.

SUMMARY OF THE INVENTION

This disclosure describes an electrical router backplane that overcomes many of the electrical and mechanical limitations of large prior art electrical backplanes, and methods for its design and fabrication. Generally, this backplane comprises multiple high-speed signaling layers of differential signaling pairs, separated by ground layers. Preferably, power distribution layers and/or low-speed signaling layers are embedded near the center of the backplane stack, between outer groups of high-speed signaling layers. Various additional design features can be combined within this general architecture to produce a backplane that has been tested for reliable communication at single trace pair differential-signaling speeds up to 10.7 Gbps, 200-ampere power distribution, and overall backplane throughput greater than 1.6 Terabits/second.

In the present disclosure, a wide range of new backplane features and manufacturing processes are disclosed, each of which contributes to the overall success of the backplane design. Preferably, these aspects are combined in a single backplane to provide an accumulation of the benefits of each aspect.

BRIEF DESCRIPTION OF THE DRAWING

The invention may be best understood by reading the disclosure with reference to the drawing, wherein.

DETAILED DESCRIPTION OF THE PREFERRED EMBODIMENTS

1 Definitions

Several terms have been assigned particular meanings within the context of this disclosure. As used herein, high speed signaling refers to signaling on a differential signal pair at a data rate greater than about 2.5 Gbps. A high-speed signaling layer or high-speed differential trace plane contains high-speed differential signal trace pairs, but may also contain lower speed and/or single-ended traces. A core dielectric layer is one that is cured and plated prior to assembly of a circuit board. A b-stage dielectric layer is one that is cured during assembly of cores into the circuit board. Differential signaling (or balanced signaling) is a mode of signal transmission, using two conductors, in which each conductor carries a signal of equal magnitude, but opposite polarity. Single-ended signaling (or unbalanced signaling) is a mode of signal transmission where one conductor carries a signal with respect to a common ground. The impedance of a differential trace is more differential than single-ended if the impedance between that trace and its differentially paired trace is less than the impedance between that trace and ground.

2 Basic Router Configuration and Operation

Figure 1:
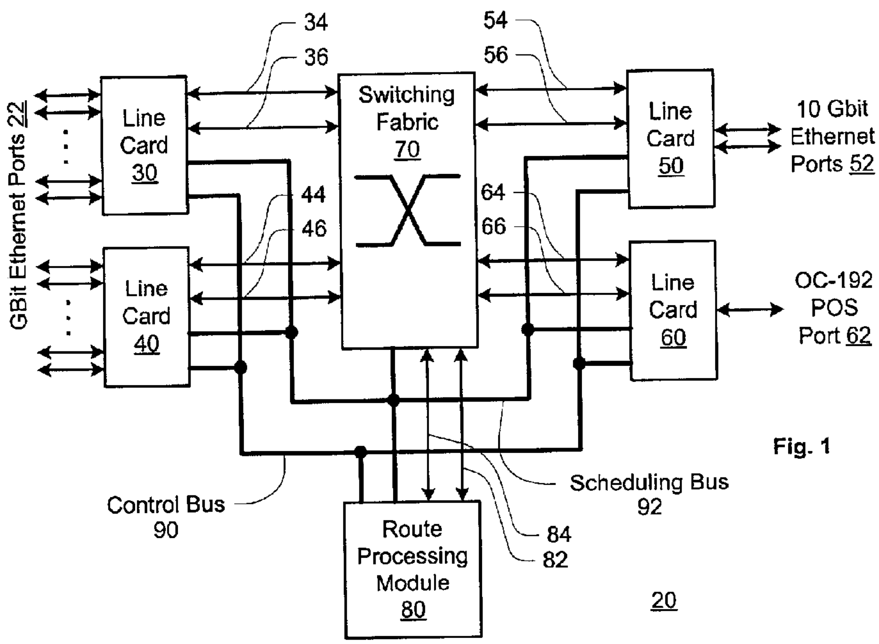
FIG. 1 contains a block diagram of a high-speed router.

By way of introduction, one type of router configuration that can take advantage of the backplanes disclosed herein will be described. FIG. 1 shows a high-level block diagram for a router 20. Line cards 30, 40, 50, and 60 provide physical ports to the device. For instance, line cards 30 and 40 can each provide up to 24 Gigabit Ethernet ports 22 into router 20. Line card 50 provides two 10-Gigabit Ethernet ports 52, and line card 60 provides an OC-192 POS (Packet-Over-Sonet) port 62. Although four line cards are shown, many backplanes provide slots to accommodate many more cards, e.g., up to fourteen line cards in the embodiment shown in FIG. 3. The user can configure device 20 to accommodate different traffic capacities, traffic models, and physical port mixes by the appropriate selection of numbers and types of line cards.

Switching fabric 70 switches each routed data packet from that packet's ingress port/line card to that packet's egress port/line card. Switching fabric 70 connects to each line card through two full duplex switching fabric port connections (see, e.g., port connections 44, 46 to line card 40). Switching fabric 70 can be reconfigured rapidly on an epoch-by-epoch basis (an epoch is a defined time slice). For instance, at one epoch, fabric 70 may be switching packets from ingress port 44 to egress port 54 and from ingress port 46 to egress port 66, and at the next epoch, fabric 70 could be switching packets from ingress port 44 to egress port 64. At any given epoch, ingress ports and egress ports are paired to utilize as many switching ports as possible without unduly delaying a particular set of packets.

Figure 3:
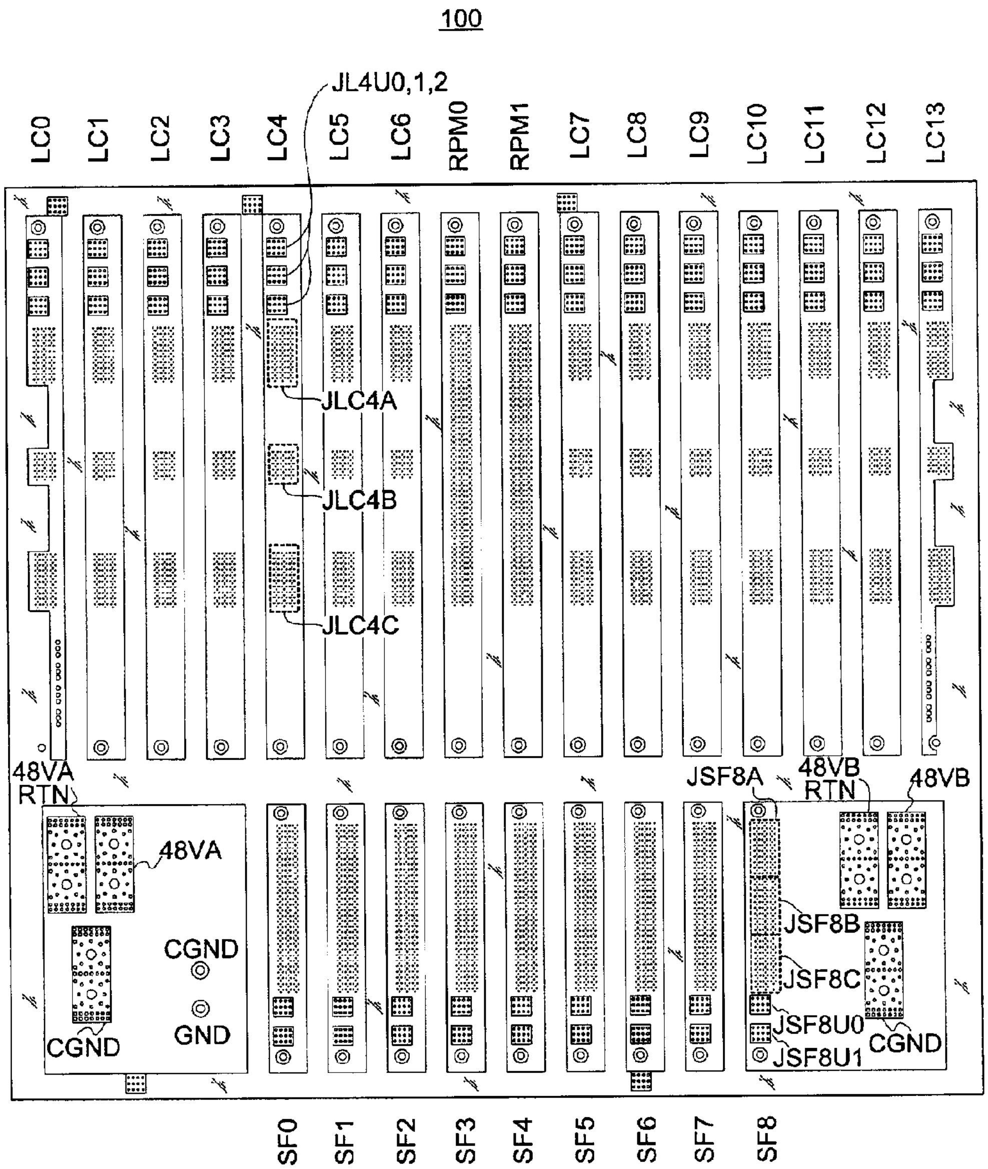
FIG. 3 shows the external layout for a router backplane circuit board according to one embodiment of the invention.

In an embodiment using the backplane of FIG. 3, the switching fabric functionality is distributed among nine identical switch fabric cards, eight of which are ganged to actively switch packet data in parallel (the ninth provides redundancy). In this configuration, a full-duplex switching fabric "port" actually comprises 18 differential pairs connected to a line card—one transmit pair from the line card to each switch fabric card, and one receive pair from each switch fabric card to the line card.

Route processing module (RPM) 80 resides on an RPM card. RPM 80 has several duties. RPM 80 is responsible for overall system operation, i.e., recognizing and booting new line cards, identifying faulty line cards, packet route discovery, and sharing routing table information with the line cards. RPM 80 also provides a user interface (not shown) to allow a system operator to configure the system and view system parameters. For each of these functions, RPM 80 generally communicates with the line cards over control bus 90. As compared to the switching fabric ports, the control bus can be a relatively low-speed channel.

Another duty of RPM 80 is scheduling switching fabric 70. In a preferred implementation, RPM 80 reconfigures switching fabric 70 every epoch. RPM 80 uses scheduling bus 92 to communicate to switching fabric 70—as well as to line cards 30, 40, 50, 60—the switching fabric configuration for the upcoming epochs. RPM 80 attempts to schedule as many fabric ports as possible during each epoch, and to ensure that data is handled promptly and fairly. As compared to the switching fabric ports, the scheduling bus can be a relatively low-speed channel.

RPM 80 also maintains its own switching fabric port connection 82, allowing it to receive and transmit packets external to the router using any of the line card physical ports. In the backplane design of FIG. 3, provision is also made for a second RPM card connected to router 20 to provide failover capability.

Figure 2:
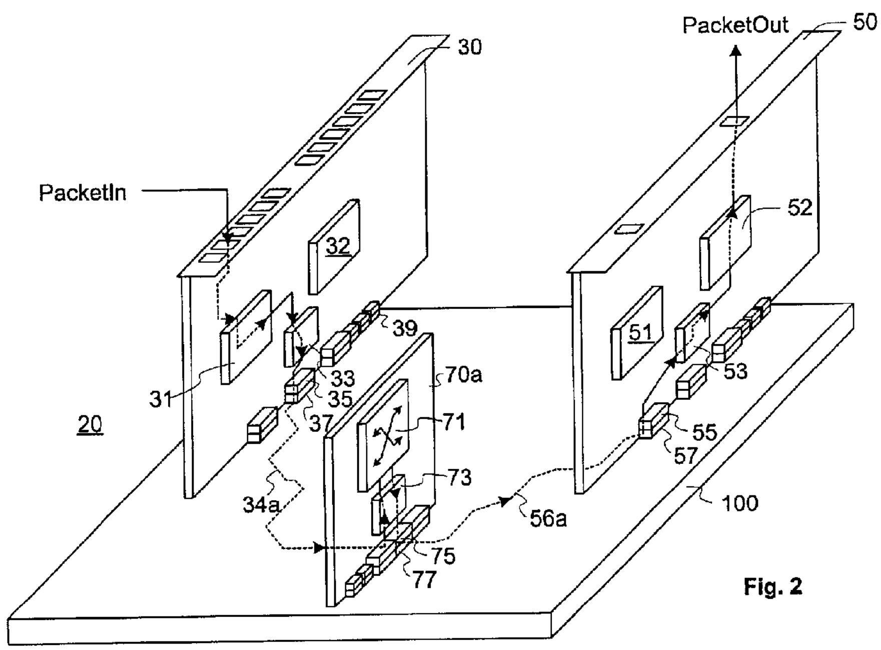
FIG. 2 illustrates one possible path for traffic entering a router at one line card and exiting the router at another line card.

FIG. 2 shows an exemplary data path taken by part of a packet as it traverses router 20. FIG. 2 depicts three cards that would be inserted in a typical system—an ingress line card 30, an egress line card 50, and a switch fabric card 70*a*. Note that a fully functional system would also contain at least seven additional switch fabric cards and at least one functioning RPM card, but these have been omitted from FIG. 2 for clarity.

Cards 30, 50, and 70*a* are shown connected to a backplane 100 using board connectors and sockets, of which the numbered connectors 35, 55, 75 and numbered sockets 37, 57, 77 are typical. The board connectors are press-fit onto their respective cards, and the matching sockets are press-fit onto the backplane. A card then can be connected to the backplane by mating the connectors with the sockets at a desired card slot. Other connectors (such as connector 39) located at each slot perform functions such as supplying power to a card.

The number of integrated circuits and division of circuitry functions on a card can be varied in many ways, as this is not critical to the present invention. In FIG. 2, line card circuitry is illustrated in one possible configuration: an ingress circuit (31 and 51) for processing packets received at the line card, an egress circuit (32 and 52) for processing packets to be transmitted by the line card, and a serdes (serializer/deserializers 33 and 53) for passing packets between the ingress/egress circuits and the switch fabric cards. Switch fabric card circuitry is illustrated in one possible configuration also: a switch 71 in communication with a serdes 73 to pass packet data between switch 71 and the line cards.

One possible data path through router 20 is shown in FIG. 2. An incoming packet PacketIn is received at a port on line card 30. Ingress circuit 31 processes the packet, determines that the appropriate router egress port is on line card 50, and queues the packet in a queue corresponding to line card 50. At an appropriate epoch, one data path of switch 71 is configured (along with the corresponding switches on the other switch fabric cards, not shown) to switch data from line card 30 to line card 50. During that epoch, serdes 33 receives the exemplary packet's data from the queue, serializes it, and transmits a portion of that data to each switch fabric card. Serdes 33 transmits the portion of that data bound for switching fabric card 70*a* over a physical path comprising connector 35, socket 37, differential pair 34*a* in backplane 100, socket 77, and connector 75. Serdes 73 receives that data, de-serializes it, and passes it to switch 71. Switch 71 switches the data to an appropriate channel for line card 50, and then passes the data back to serdes 73. Serdes 73 reserializes and transmits the data over a physical path comprising connector 75, socket 77, differential pair 56*a* in backplane 100, socket 55, and connector 57. Serdes 53 combines the serial data received from the switch fabric cards and passes the de-serialized data to egress circuit 52. Egress circuit 52 performs additional packet processing, and queues the packet for transmission out the appropriate egress port as PacketOut.

3 Backplane Lateral Layout

The description of the backplane design is divided into two sections. This first section describes aspects of the embodiments of the invention as they relate to the lateral layout of the backplane. A second section will describe aspects of the embodiments of the invention as they relate to the backplane cross-section design.

3.1 General Arrangement

FIG. 3 shows a detailed backplane-plating layout for a router 20 and backplane 100 as described in FIGS. 1 and 2. A top panel region of backplane 100 has connector regions ("slots") for sixteen cards. The outboard seven slots on each end are each configured to accept a line card (slots LC0 to LC6 and LC7 to LC13). The middlemost two slots are each configured to accept a route-processing module (slots RPM0 and RPM1). Each slot has three upper connector regions (e.g., regions JL4U0, JL4U1, and JL4U2 for slot LC4) used to distribute power and ground signals to a card. Below these, each line card slot has three high-speed connector regions (e.g., regions JLC4A, JLC4B, and JLC4C for slot LC4). The RPM slots serve more card connections than the line card slots, and therefore use a larger high-speed connector region. In one embodiment, the high-speed connector regions are laid out to accept HS3 press-fit sockets, available from Tyco Electronics Corporation (formerly AMP Incorporated).

A bottom panel region of backplane 100 contains connector regions or slots for nine cards. Each of these slots in configured to accept a switch fabric card (slots SF0 to SF8). Each slot has two lower connector regions (e.g., regions JSF8U0 and JSF8U1 for slot LC8) used to distribute power and ground signals to a switch fabric card. Above these, each switch fabric card slot has three high-speed connector regions (e.g., regions JSF8A, JSF8B, and JSF8C for slot SF8).

The bottom panel region also contains connector regions for connecting power and ground to the backplane. Two 48-volt power distribution layers are embedded in backplane 100, an "A" power distribution layer and a "B" power distribution layer. At the lower left of backplane 100, two large multi-thru-hole regions 48VA and 48VA RTN allow for connection of "A" power supply and return leads to one power supply, and a third large region CGND allows for connection of a common ground. Similar connections for a "B" power distribution layer to a second power supply exist at the lower right of backplane 100.

3.2 Signal Distribution

One advantage of the layout of FIG. 3 is that it allows for efficient routing of the high-speed signaling connections between the various cards. The RPM card slots are centrally located, as they require the highest number of connections. The switch fabric cards are also centrally located, but below the line cards and RPM cards, providing routing room for the connections between the switching fabric card rank and the line/RPM card rank.

As will be described below, the preferred backplane embodiments utilize specific combinations of high-speed signaling layers, low-speed signaling layers, and power distribution layers to provide the connections necessary for router functionality. The high-speed connector regions of backplane 100 interconnect using the high-speed signaling layers. Although connections that operate at relatively low speeds—such as the router's control bus, scheduling bus, and clock distribution traces—can also utilize the high-speed layers, separate low speed layers are preferably provided for them. The power distribution layers are used to distribute power from the router's power supplies to the router's cards.

3.2.1 Differential Pair Configuration

High-speed signaling across the backplane preferably utilizes differential trace pairs. One aspect of the present invention therefore involves the routing layout of differential trace pairs within the high-speed signaling layers. Achieving a workable routing layout using pre-existing techniques would be, at best, difficult, due to several other attributes of the preferred embodiments. For instance, the preferred pitches for differential pairs are eight mil traces on sixteen-mil spacing and seven mil traces on seventeen mil spacing—much wider than a conventional differential pair (e.g., eight mil spacing for eight mil traces) might use. This preferred pitch decreases achievable differential pair routing density on a given signaling layer. Also, in order to limit maximum trace length and pack a large number of cards into a standard rack-mounted chassis space, routing space between cards (and their respective connector regions) has been limited—when combined with the preferred differential pair pitch, the resulting configuration allows only about five differential pairs to be routed side-by-side between any two adjacent cards on a given signaling layer. Further, to ensure manufacturability, the number of high-speed signaling layers is also limited, e.g., to ten in this embodiment.

3.2.2 Typical Routing Paths

Figure 4:
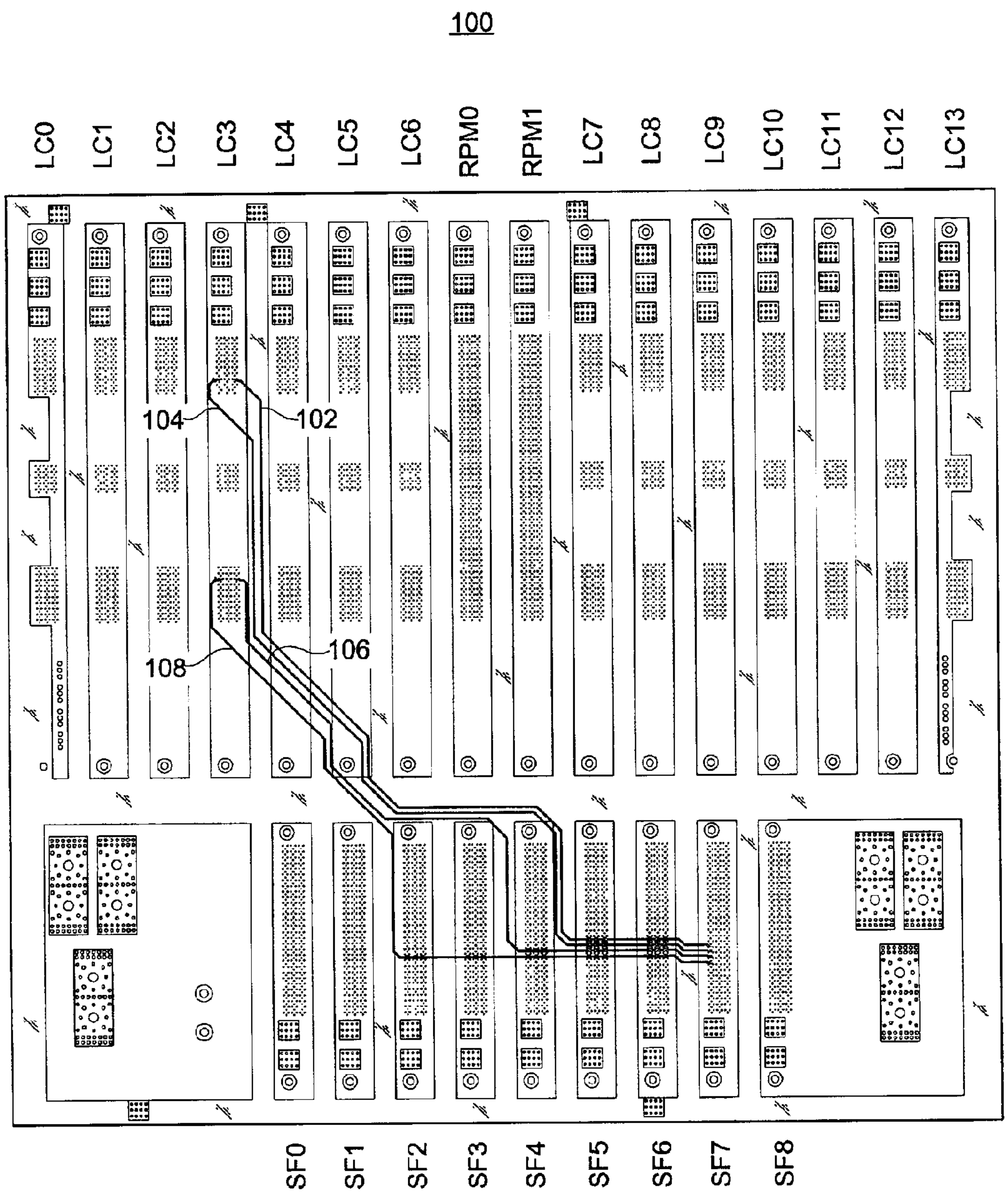
FIG. 4 shows the same layout as FIG. 3, with superimposed internal differential pair trace routing for the connections between one line card and one switching fabric card.

Within the constraints identified above, FIG. 4 illustrates high-speed differential pair routing for one exemplary line card slot to switch fabric card slot. Each line card slot (and RPM slot) connects in similar fashion to each switch fabric card slot for purposes of high-speed signaling. As shown in FIG. 4, line card slot LC3 connects to switch fabric card slot SF7 via four differential pairs 102, 104, 106, 108. Two of these differential pairs are used for high-speed signaling from LC3 to SF7; the remaining two are used for high-speed signaling in the opposite direction.

In some embodiments, some (or all) differential pairs connecting switch fabric card slot SF7 to the other line card (and RPM) slots reside on a common high-speed signaling layer with differential pairs 102, 104, 106, 108. The non-illustrated pairs route in similar fashion to the illustrated pairs, with line card slots nearer the center of the backplane connecting to SF7 nearer its top, and line card slots nearer the ends of the backplane connecting to SF7 nearer its bottom. Left-side line card slots generally connect to thru-holes on the left of slot SF7, and right-side line card slots connect to thru-holes on the right of slot SF7. Generally, similar routing exists on the other high-speed signaling layers as well (each layer generally serving one switch fabric card slot), with one exception that will be described shortly.

3.2.3 Paths Through Connector Regions

Because in this type of embodiment a large number of differential pairs (more than 60 in some cases) route to one switch fabric card slot on each high-speed signaling layer, at least some pairs must pass through the connector regions for other switch fabric card slots if a tight card spacing and short switch fabric card height are to be maintained. In FIG. 4, pairs 102 and 104 pass through two connector regions each (SF5 and SF6), pair 106 passes through three connector regions (SF4, SF5, and SF6), and pair 108 passes through five connector regions (SF3, SF4, SF5, and SF6). In a worst case, a differential pair may have to pass through eight switch fabric connector regions.

The connector regions are densely populated with alternating rows of signal and ground pins, again, in order to minimize space requirements. One aspect of the invention involves a particular way of routing differential pairs through the connector regions that largely avoids crosstalk and signal attenuation. Exemplary differential pair routings of this type are illustrated in the scale drawing of FIG. 5.

Figure 5:
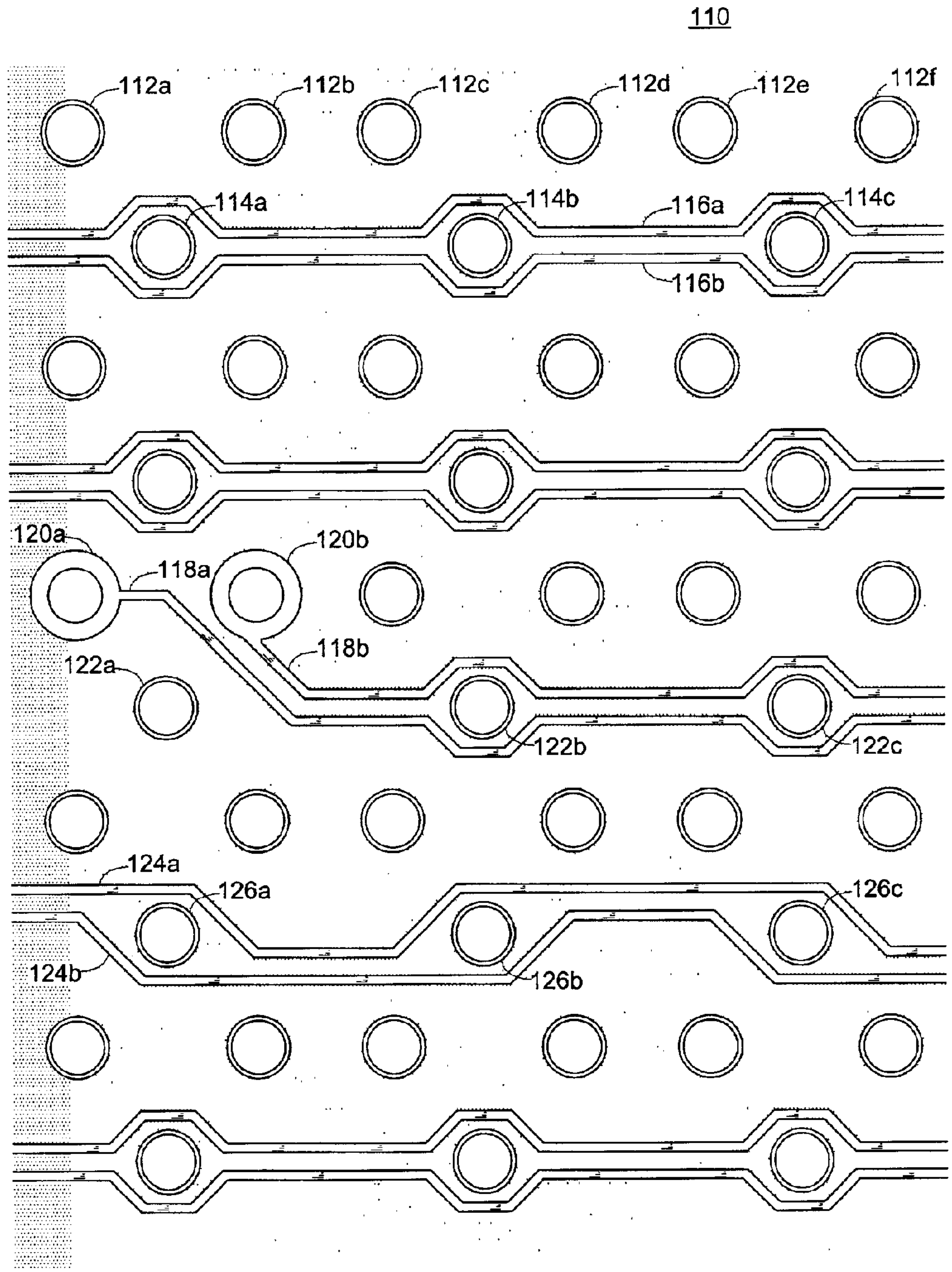
FIG. 5 shows several high-speed differential signal trace pairs passing through a card connector region of a router backplane.

FIG. 5 illustrates in top view a segment 110 of a high-speed signaling layer, showing typical scale spacing for the thru-holes in a connector region. This segment contains rows of six signaling pin thru-holes (e.g., holes 112*a–f* in one row) alternating with rows of three ground pin thru-holes (e.g., holes 114*a–c* in one row). The configuration is typical of a thru-hole pattern used with an AMP HS3 connector.

Each thru-hole is plated, with each signaling thru-hole used in the backplane potentially carrying a high-speed signal. Thus the potential for signal interference exists each place that a differential pair is routed past a signaling thru-hole. The preferred embodiments minimize this potential interference by routing differential pairs through connector regions in an alignment that intersects a row of ground pin thru-holes (see, e.g., differential pair 116*a*, 116*b*). This places the differential pairs as far as possible from the neighboring signaling pin thru-holes, and at the same time largely maintains the desirable impedance characteristics of each trace pair as it traverses the connector region.

The traces of the differential pairs already route with approximately a six- to eight-mil spacing, measured vertically in the material stack, from adjacent ground planes. Consequently, very little net trace-to-ground impedance effect results from passing such a trace horizontally past a ground pin thru-hole (connected to those same ground planes) by roughly a ten-mil spacing. Further, the use of traces that are only slightly more differential than single-ended allows pairs of traces to split and couple with a thru-hole without greatly affecting transmission.

The preferred embodiments use a routing layout that splits a differential pair as it approaches a ground-pin thru-hole, allowing one trace to pass on one side of the hole and the other trace to pass on the other side of the hole. Once past the thru-hole, the two traces rejoin in the differential configuration on the opposite side of the hole. This approach advantageously allows the differential pair to retain a differential configuration along much of its path through a via connection region, while avoiding interference to a large degree with signals present in signaling thru-holes in that via connection region.

In the preferred configuration (illustrated by differential pair 116*a*, 116*b*), the centerline of the differential pair is aligned with the centerline of the row of ground pin thru-holes (114*a–c*). As traces 116*a* and 116*b* approach ground pin thru-hole 114*a* from the left, the traces turn and separate at approximately a 90-degree angle (the traces routed respectively at plus and minus 45 degrees from their original direction of travel) until separated by more than the clearance required for the thru-hole. The traces then turn back and pass the thru-hole parallel to each other, and rejoin again at approximately a 90-degree angle until reaching the original differential configuration. Traces 116*a* and 116*b* route in substantially the same manner around ground pin thru-holes 114*b* and 114*c* before exiting the card connector region.

Although the routing illustrated for traces 116*a*, 116*b* is preferred, other routings are possible. For instance, differential pair 124*a*, 124*b* approach ground pin thru-hole row 126*a–c* slightly off axis from the left, allowing trace 124*a* to pass just above thru-hole 126*a* without turning. Trace 124*b* turns downward to pass just below thru-hole 126*a*, and then straightens out. After trace 124*a* passes thru-hole 126*a*, it also turns downward to rejoin trace 124*b* in a differential configuration. On approaching ground pin thru-hole 126*b*, this pattern is reversed as the differential pair jogs back upwards, and so on. An advantage of this routing is that it requires only half the trace turns required by the routing of traces 116*a*, 116*b*. Disadvantages are that the traces are placed somewhat nearer some adjacent rows of signaling thru-holes, and the traces depart from their differential configuration for longer segments.

FIG. 5 illustrates other useful differential pair constructs. For instance, differential pair 118*a*, 118*b* is routed through region 110 to two signal pin thru-holes 120*a*, 120*b*. This differential pair remains aligned with a row of ground pin thru-holes (122*a–c*) until reaching the proximity of signal pin thru-holes 120*a*, 120*b*. The differential pair then angles towards signal pin thru-holes 120*a*, 120*b* such that the differential configuration is maintained as long as possible.

3.2.4 Differential Pair Path Matching

Figure 6:
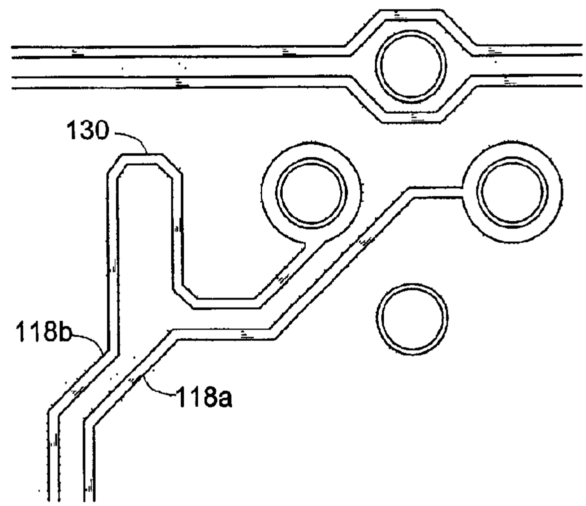
FIG. 6 shows a high-speed signal trace pair on one signaling plane of a router backplane connected to a pair of signal thru-holes, with a loop in one trace to equalize trace length.

Note that as described and shown in FIG. 5, differential trace 118*a* is slightly longer than differential trace 118*b*. In some situations, it may be possible to reverse this configuration on the other end of the trace pair, such that trace length is equalized. Removing path mismatch present at one end of a differential pair by an offsetting mismatch at the other end of the pair is not, however, always possible or preferable. Accordingly, FIG. 6 illustrates a trace termination configuration for use in such situations. A looped jog 130 is placed near the source end of trace 118*b*, thus approximately equalizing the length of nominally shorter trace 118*b* with the length of nominally longer trace 118*a*.

Note that as shown in FIG. 6, looped jog 130 more than compensates for the extra length in trace 118*a*. This extra length in trace 118*b* also compensates for a path length difference in the AMP HS3 connector for the pins that connect to traces 118*a* and 118*b*. Simply crossing the traces could compensate for the connector path length difference, such that at the exit end of the traces trace 118*b* connected to the connector pin with the longer path length. In the disclosed embodiments, this is non-preferred. Otherwise, the rising signal edge on one trace and the corresponding falling signal edge on the other trace will be misaligned over the entire backplane path, causing signal distortion and diminishing the common-mode noise rejection capability of the differential pair. Note that it is extremely difficult to completely eliminate misalignment between the rising and falling signal edges on a differential pair, but the described jog technique greatly diminishes the problem.

3.3 Power Distribution

The preferred embodiments utilize a novel power distribution scheme employing four relatively thick conductive planes near the center of the backplane for power distribution to the line and switch fabric cards. These planes provide a relatively noise-free and economic power distribution scheme for a router, as compared to more conventional power distribution approaches such as bus bars or separate power distribution circuit boards. The present embodiments are believed to be the first backplanes capable of distributing 100 amperes or more of current to attached components (in the preferred embodiment, two distinct power distribution planes are each capable of distributing 200 amperes of power).

3.3.1 Power Blocks/Location

FIG. 3 shows the power entry/exit points for a preferred backplane embodiment. The large plated regions 48VA, 48VA RTN, 48VB, and 48VB RTN provide connection points for redundant A and B power supplies. From these corner locations, power is fanned out to thru-holes for the switch fabric power connectors (e.g., JSF8U0 and JSF8U1) arranged along the bottom of the backplane and thru-holes for the line and RPM card power connectors (e.g., JL4U0, JL4U1, and JL4U2) arranged along the top of the backplane. This arrangement is preferred, in part, because it leaves more trace routing room near the center of the backplane for creating shorter high-speed traces.

3.3.2 Via-Free Paths

Figure 7A:
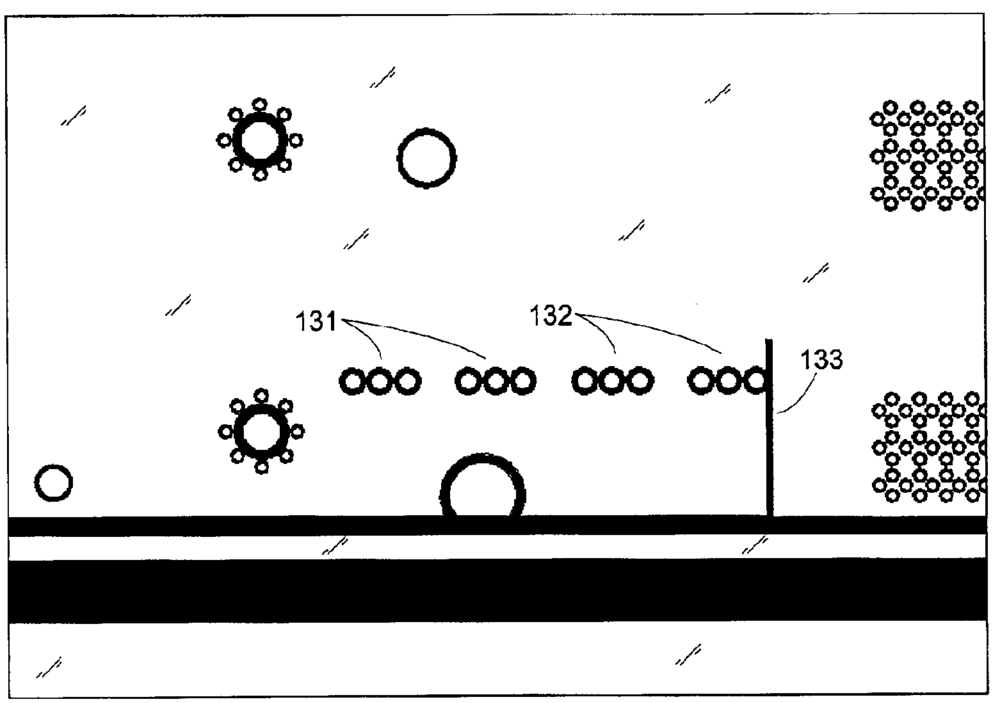
FIG. 7A contains a magnified section of the mask of FIG. 7, showing an isolation cutout used for isolating mechanical equipment power from router card power.
Figure 7:
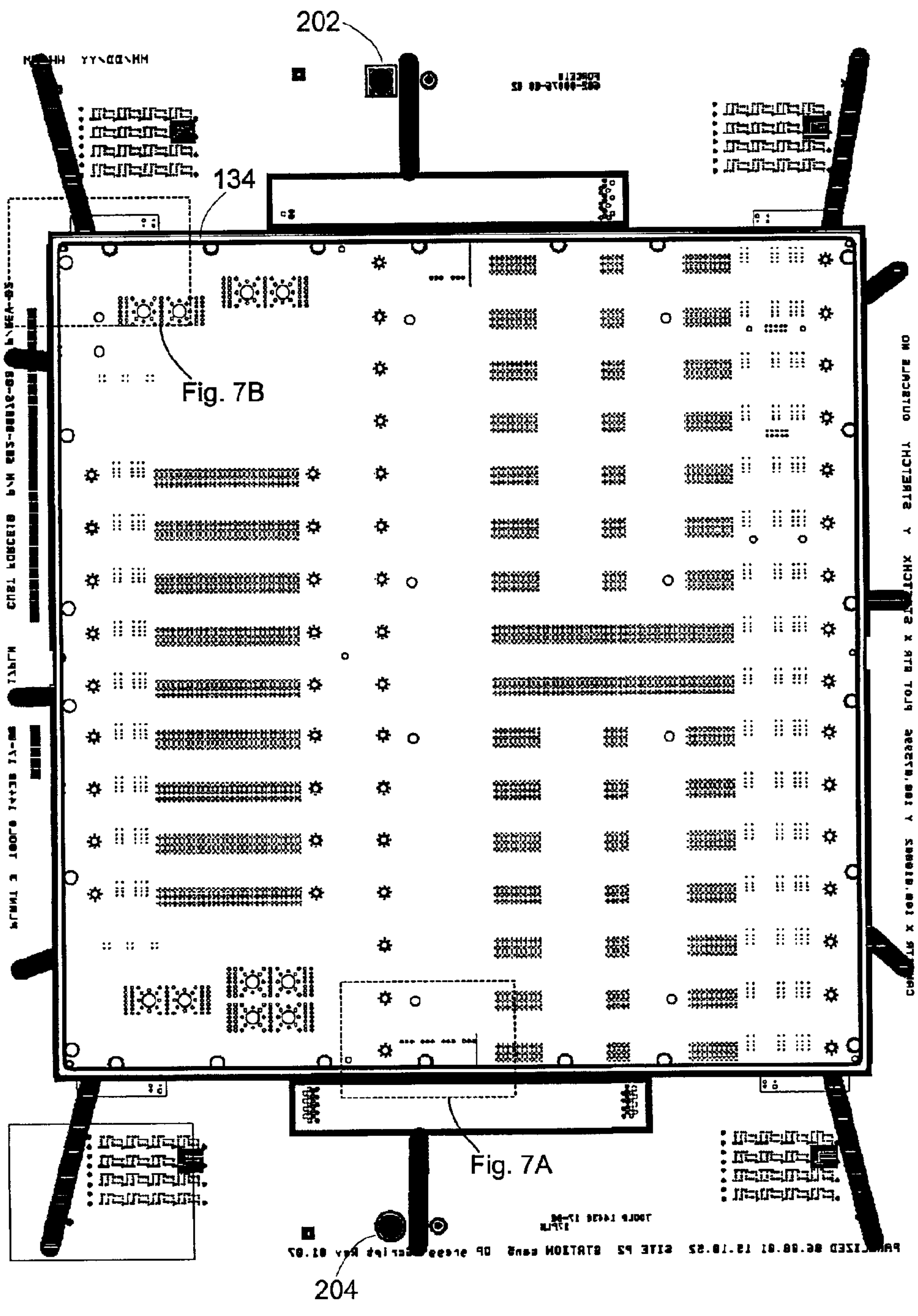
FIG. 7 shows the panel mask for one power plane of a router backplane.

FIG. 7 illustrates a panel mask for the 48VA power distribution plane, with dark areas representing areas where copper will be etched away during patterning. In FIG. 7 the panel mask has been turned ninety degrees clockwise with respect to FIG. 3. It can be appreciated from FIG. 7 that power distribution is enhanced by the existence of a large central substantially via-free path (populated in this embodiment by a relatively few holes for board alignment pins). This region, lying between the leftmost line card/RPM high-speed connectors and the rightmost switch fabric high-speed connectors in FIG. 7, provides a wide path capable of distributing several hundred amperes of current.

The areas between the high-speed connectors for adjacent cards are also substantially via-free. This allows power distributed through the central via-free path to channel freely between adjacent rows of high-speed connectors in order to reach power blocks near the top and bottom of the backplane.

One aspect of the via-free path concept is an adherence to a routing design that avoids layer-swapping vias. In other words, every signal injected at a thru-hole to a given signal plane of the board is extracted from a second thru-hole to that same signal plane, with no intermediate via(s), connected to two signal planes, that swaps the signal to a different plane. A layer-swapping approach is often taken in the prior art to solve routing problems, but is specifically avoided in the preferred embodiments of the present invention. This not only improves power distribution, but also avoids the creation of extraneous reflections due to intermediate vias in high-speed signal paths.

3.4 Noise Suppression

As mentioned previously, one advantage of the embedded power distribution layers of the preferred embodiments is enhanced noise suppression as compared to conventional methods of power distribution. Some aspects of this noise suppression relate to the layer ordering of the backplane, and will be discussed in Section 4. Other aspects relate to the horizontal plan of the power distribution planes, in particular the use of isolation cutouts and the use of a copper guard ring.

3.4.1 Isolation Cutouts for Fan Power Distribution

In the preferred embodiment, the backplane distributes power not only to the switch fabric, RPM, and line cards, but also to power connectors for a complement of fan trays that provide convection air-cooling for the router. Consequently, the possibility exists for the fan motors to induce motor-generated noise in the backplane power layers—noise that could propagate to the power circuitry for the sensitive electronics on the router's cards. To decrease the degree to which such noise could reach the router's cards, "isolation cutouts" are designed into the power distribution layers.

FIG. 7A shows a section of the mask of FIG. 7. Thru-hole groups 131, 132 serve fan tray power connectors in a completed router. Thru-hole groups 131, 132 enjoy a fairly short and unimpeded backplane path to the backplane power attachment points for 48VB supply and return (see FIG. 3). This path does not pass near the power connectors for any router card. But the power distributed to, in this instance, at least line card LC13 (see FIG. 3) would tend to flow in large part past thru-hole groups 131, 132 were it not for the presence of cutout 133. Cutout 133 in effect raises the resistance of a current path between the backplane power attachment points and the LC13 power connectors that would include thru-hole groups 131, 132, severely decreasing the share of current carried by such a path.

3.4.2 Copper Guard Ring on Power Distribution Layers

FIG. 7 shows a mask for the entire "panel" for a backplane, including alignment markings, test structures (including "coupons"), and flow dam structures. After panel fabrication, the backplane board is cut from the panel. Several issues regarding this cutting process—and the resulting board configuration and performance—are addressed by a particular design employed on each power plane near the board edge, as described in this section.

The 48-volt power distribution planes are preferably patterned in a manner that leaves as much copper as possible near the board edge in the panel, in order to decrease the possibility of board edge delamination at these particularly thick layers. But the 48-volt power distribution planes practically cannot extend too close to the edges of the backplane board for at least several reasons: tools commonly used for separating the backplane from the panel wear quickly when cutting through copper, and have finite tolerances; the edge of the backplane will be grounded in the final product; quite a bit of digital noise projects from the edges of the high-speed layers, which may be coupled to the distributed power if the power planes extend to the edges of their respective layers; and product test laboratories such as Underwriters Laboratories specify a large minimum clearance from the edge of a board to any power trace (e.g., 62 mils minimum for one embodiment).

Figure 7B:
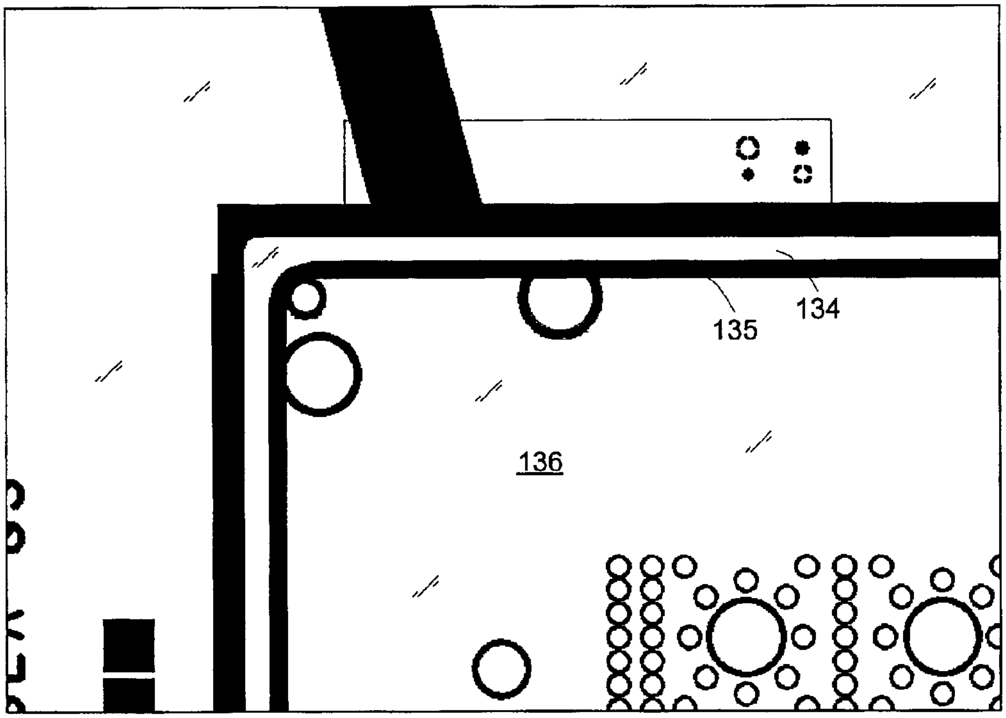
FIG. 7B contains a magnified section of the mask of FIG. 7, showing a guard ring that surrounds the power plane.

These seemingly conflicting design concerns are solved in the preferred embodiments using a copper guard ring 134 on power distribution layers. As shown in FIG. 7 and in the magnified section of FIG. 7B, a copper guard ring 134 is patterned around the periphery of the power distribution layer. Copper guard ring 134 approaches to within approximately 15 mils of the intended edge of the board. Holes drilled through the copper guard ring at regular intervals and then plated (not shown in the mask) allow the guard ring to be tied to chassis ground during board plating. The power plane 136 is separated from copper guard ring 134 by a moat 135.

The copper guard ring provides several advantages. First, because the guard ring may exist much nearer the board edge than a power trace, board edge delamination problems at power distribution layers can be reduced or eliminated. Second, in the case of inadvertent delamination at some point on the board's periphery prior to edge plating, if the edge plating shorted, it would short harmlessly to chassis ground at the guard ring. Third, the guard ring provides an additional level of isolation between each power plane and noise injected at the board edges.

4 Backplane Cross-Section

Although many advantages exist due to improvements in the plan layout of the preferred backplane embodiments, perhaps even more advantages exist in the design of the backplane cross-section, i.e., how layers are arranged to work together in the material "stack" of the backplane. Two general material stacks are described below. The first, a "hybrid" stack, utilizes two different types of dielectric materials in the material stack. The second type of stack uses a single dielectric material in the material stack, but the material used is a high-speed dielectric that was previously thought to be impossible to fabricate into a board of this thickness.

4.1 General Layer Arrangement—Hybrid Lamination Design

Figure 8:
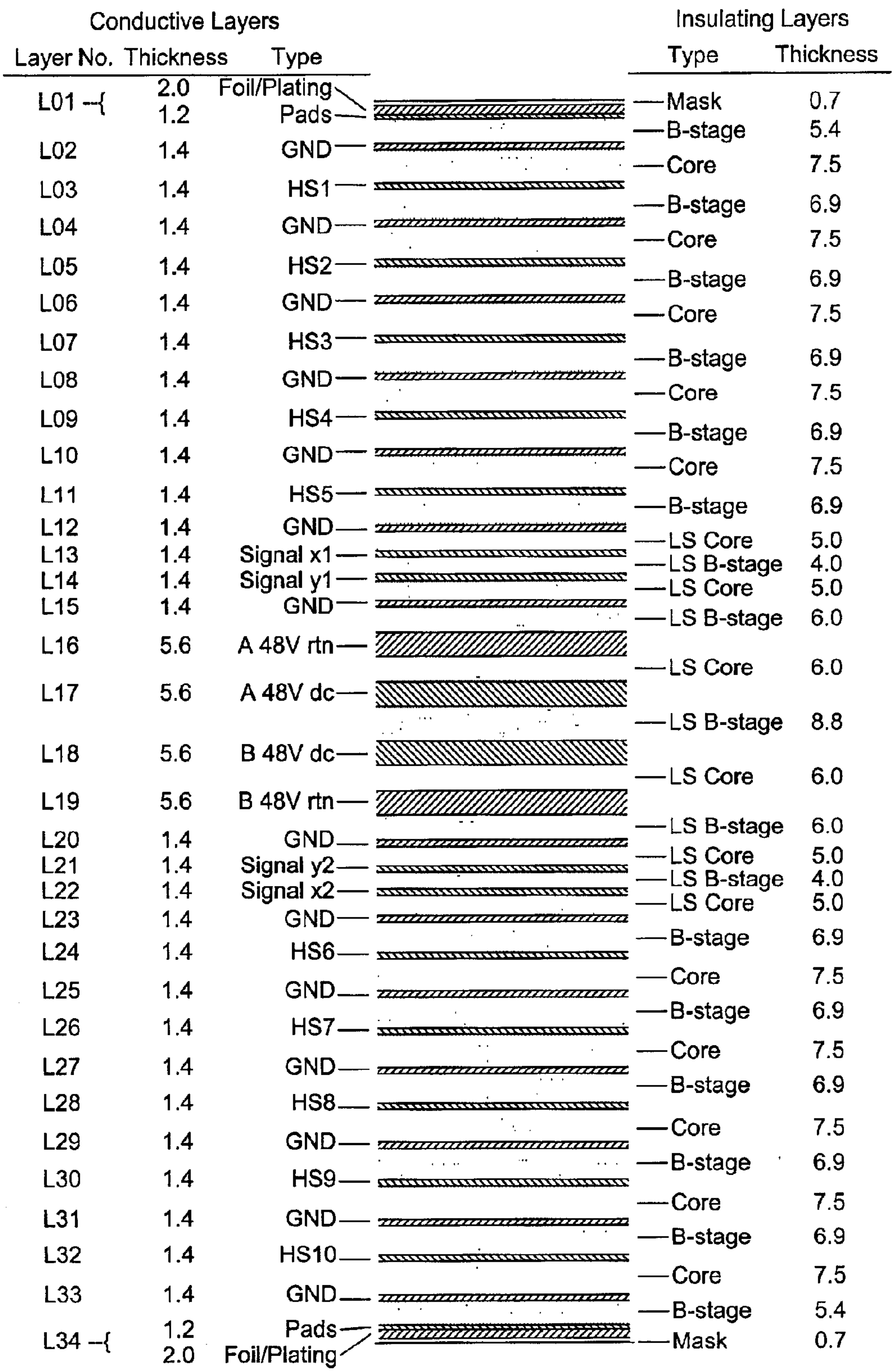
FIG. 8 shows the complete material stack in cross-section for a router backplane according to a hybrid dielectric embodiment of the invention.

FIG. 8 illustrates the entire cross-section of the material stack in one preferred backplane using a hybrid material stack. The material stack of FIG. 8 has 34 conductive layers L01 to L34 and appropriate insulating layers. For each conductive layer, FIG. 8 labels that layer with a layer thickness in mils and an identifier for the layer. Layers labeled "GND" are digital ground plane layers. Layers labeled "HSn" are the high-speed signaling layers, where n represents the layer number. Layers labeled "Signal xn" and "Signal yn" are the low-speed signaling layers. The two "A 48V" layers are the supply ("dc") and return ("rtn") for one power supply, and the two "B 48V" layers are the supply and return for the other power supply. For each insulating layer, the layer is accompanied by a description of whether the layer is a core or a b-stage layer, whether the layer is of low-speed ("LS") material, and the final thickness of the layer in mils.

Several general observations regarding the material stack of FIG. 8 will be made before proceeding to a more specific description. First, the low-speed signaling and power distribution layers use a conventional dielectric, such as FR4 (e.g., available in the "N4000-6" product family line from Park/Nelco), with good reflow and adhesion characteristics that improve the board integrity near the thicker power distribution layers. The thinner high-speed layers use a dielectric with significantly lower loss at the multi-Gbps signaling rates of the preferred embodiments, such as a thermosetting allylated polyphenylene ether (APPE, e.g., the "N6000-21" product family line available from Park/Nelco). The dielectric material transition points occur at digital ground planes L12 and L23, which are formed on FR4 core and then bonded to N6000-21 b-stage materials.

Also notable in this material stack is that each high-speed layer (with its differential signaling traces) is formed approximately equally spaced from and between two digital ground planes, e.g., high-speed layer HS1 is formed on layer L03, between ground planes at L02 and L04. Similarly, low-speed signaling layers L13 and L14 are isolated from the remaining stack by two digital grounds (L12 and L15), low-speed signaling layers L21 and L22 are isolated by two digital grounds (L20 and L23), and the four power distribution layers L15 to L19 are isolated from the remaining stack by two digital grounds (L15 and L20) at the center of the material stack. Further, the two power supply planes are placed between the two power return planes to provide yet one more layer of isolation. The result is a material stack that efficiently manages electromagnetic interference (EMI) to provide clean power distribution and good isolation for the high-speed signals.

One additional observation is that in order to provide these capabilities, the complete material stack is relatively thick compared to prior art boards, i.e., approximately 280 mils including 34 conductive layers. This required the development of new fabrication techniques, as will be described in Section 5.

4.2 General Layer Arrangement—Single-Lamination-Material Design

Figure 9:
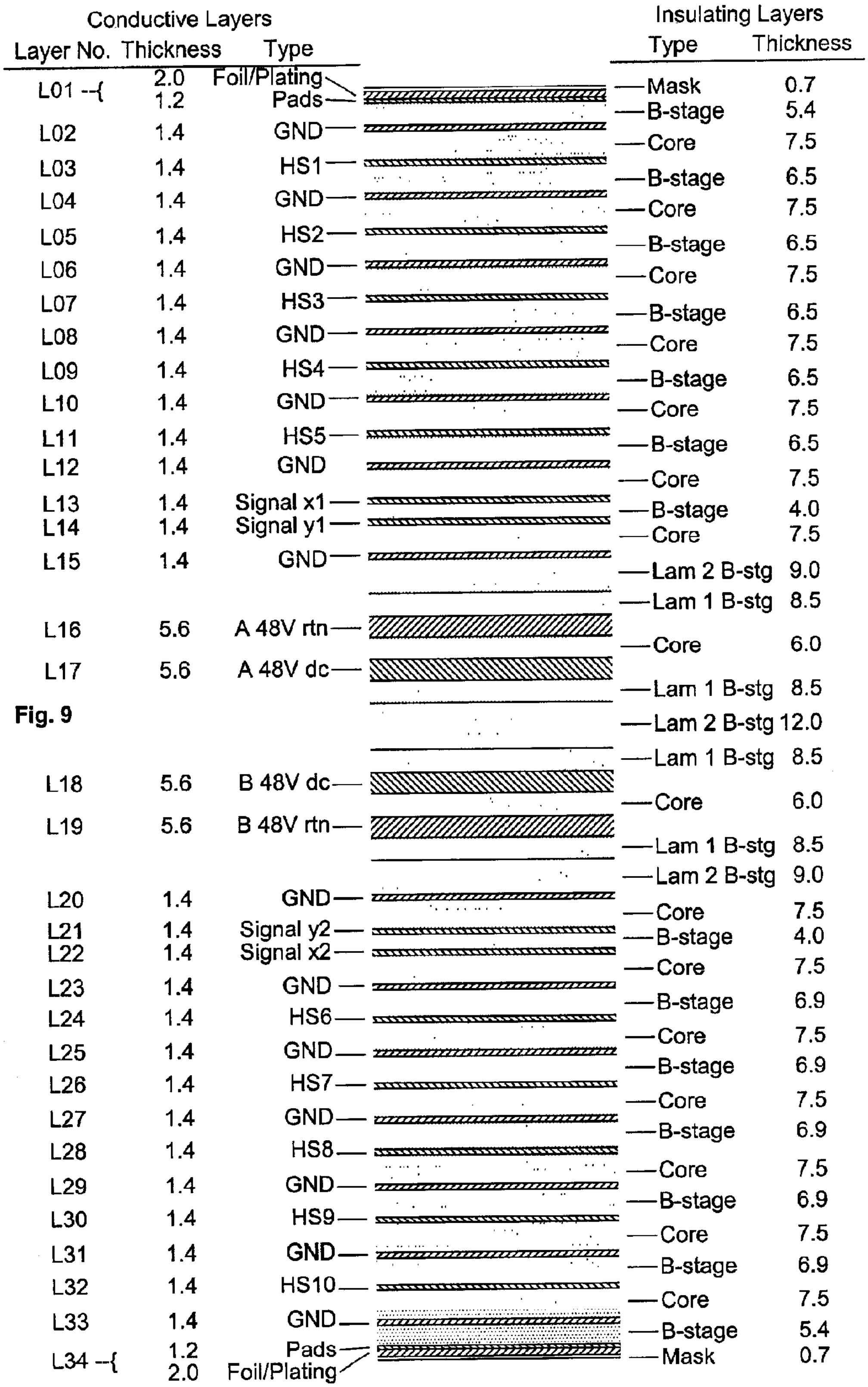
FIG. 9 shows the complete material stack in cross-section for a router backplane according to a singe-dielectric-material embodiment of the invention.

A second material stack embodiment is illustrated in FIG. 9. Although similar in many ways to the material stack shown in FIG. 8, the material stack in FIG. 9 differs in several respects. Foremost, FIG. 9 uses N6000-21 dielectric material exclusively (of several different resin contents), resulting in a different thickness (and a different fabrication process) for some of the centermost layers, and producing a thicker finished board at approximately 335 mils. Other differences exist as well. These will be detailed during the description in Section 5.

4.3 Signal Distribution

As described generally above, high-speed signals route along the ten high-speed signaling layers HS1 to HS10. This section describes backplane material stack considerations for high-speed signaling.

4.3.1 High-Speed Differential Pair Cross-Section

Figure 10:
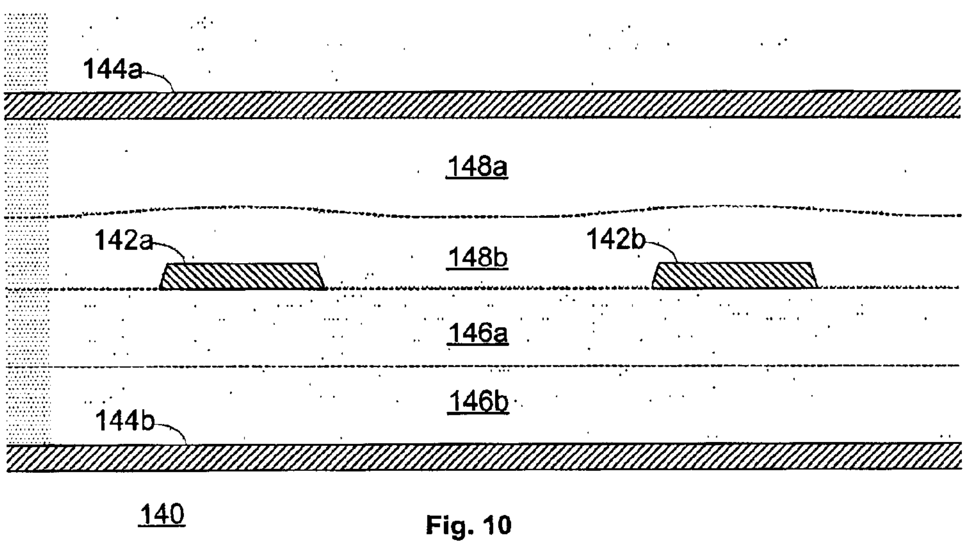
FIG. 10 illustrates a cross-section through one section of a router backplane high-speed signal layer, illustrating a trace/ground plane/dielectric layer configuration according to an embodiment of the invention.

FIG. 10 illustrates in cross-section a segment of a typical high-speed layer 140. This segment cuts cross-wise across a differential pair 142*a*, 142*b* and the two adjacent digital ground planes 144*a* and 144*b*. Two layers of 3313 N6000-21 50.6% resin content core material 146*a*, 146*b* space the bottom of pair 142*a*, 142*b* approximately 7.0 to 7.5 mils from lower ground plane 144*b*. Two layers of cured (after assembly) 3313 N6000-21 50.6% resin content b-stage material 148*a*, 148*b* space the top of pair 142*a*, 142*b* approximately 6.0 to 6.9 mils from upper ground plane 144*a*. The grain of the dielectric materials is aligned left-to-right across the backplane.

Several trace geometries have been used in the backplane embodiments. In one embodiment used with the hybrid material stack, traces 142*a* and 142*b* of FIG. 10 are each 8 mils wide at the bottom, 7.6 mils wide at the top, and 1.4 mils high (i.e., formed of 1-ounce copper). The traces are separated by a horizontal distance (measured at their bottoms) of 16 mils. In this configuration, the single-ended (even) impedance of each conductor is approximately 45.7 ohms, whereas the differential (odd) impedance of each conductor is approximately 44.6 ohms. This differential pair configuration is thus marginally more differential than single-ended.

In one embodiment used with the N6000-21-only material stack, traces 142*a* and 142*b* of FIG. 10 are each 7 mils wide at the bottom, 6.6 mils wide at the top, and 1.4 mils high. The traces are separated by a horizontal distance (measured at their bottoms) of 17 mils. In this configuration, the single-ended impedance of each conductor is approximately 48.2 ohms, whereas the differential (odd) impedance of each conductor is approximately 47.3 ohms. One attractive feature of this configuration is that for N6000-21 material, the intrinsic material impedance of 48 ohms is very close to, and between, the even and odd impedance values.

As will be described below, the differential pair impedance characteristics have been carefully matched to the thru-hole impedance characteristics to largely preserve the eye pattern for a high-speed differential signal passing through the backplane.

4.3.2 Nonfunctional Pads and Thru-hole Configuration for Equalization

In the preferred backplanes, the backplane utilizes a significant number of conductive layers in order to pass a large number of signals and supply power to circuit cards. The large number of layers results in a material stack—and corresponding thru-hole length—of around three hundred mils. At a high-speed signaling bitrate of 3.125 Gbps and using a 01 bit pattern, center-to-center times between consecutive signaling "eyes" on a differential pair will be 320 Ps. With a propagation speed of 6.29 mils per picosecond, the center-to-center separation between consecutive eyes traveling along a differential pair is only 2000 mils, or about three times the round-trip thru-hole length. The actual eye opening with a 01 bit pattern may be much shorter—120 ps in some cases, corresponding to a distance of about 750 mils along the pair. Thus when a thru-hole is considered for what it is electrically—a stub on a transmission line—it can be appreciated that for signaling at 3.125 Gbps and higher rates on the preferred backplanes, thru-hole reflections can present a serious problem with thru-holes of such length.

It is recognized herein that it is possible to manipulate the single-ended impedance of the backplane thru-holes and differential pairs to permit higher-frequency operation of a backplane. The effect of matching the response of the thru-holes and differential pairs can be appreciated by examining the simulated eye patterns shown in FIGS. 11–14.

Figure 11:
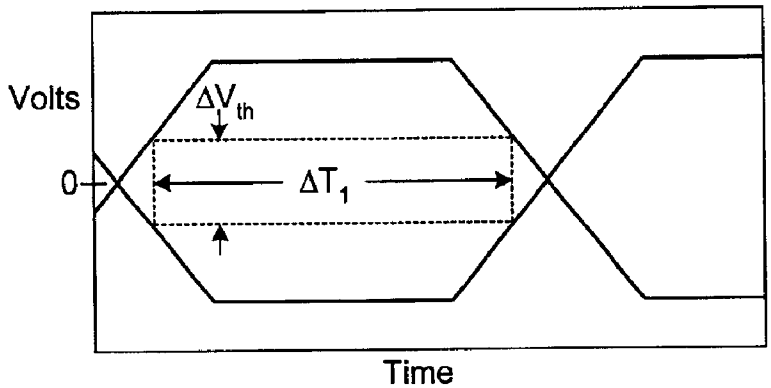
FIG. 11 depicts an ideal eye diagram for a differential signal.

FIG. 11 illustrates an ideal eye pattern for a series of signal transitions that could theoretically be launched into a backplane. The "eye" of the eye pattern is the opening between temporally adjacent signal transitions. The differential receiver requires a minimum eye "opening" in order to detect a signal transition, i.e., the voltage on the positive-going trace must exceed the voltage on the negative-going trace by at least some threshold voltage $\Delta V_{th}$ for at least some minimum amount of time $\Delta T_{min}$ before a transition can be detected. In FIG. 11, the duration of the eye opening is shown as $\Delta T_1$. If $\Delta T_1$ exceeds $\Delta T_{min}$, a receiver should be able to distinguish the signal transition.

Figure 12:
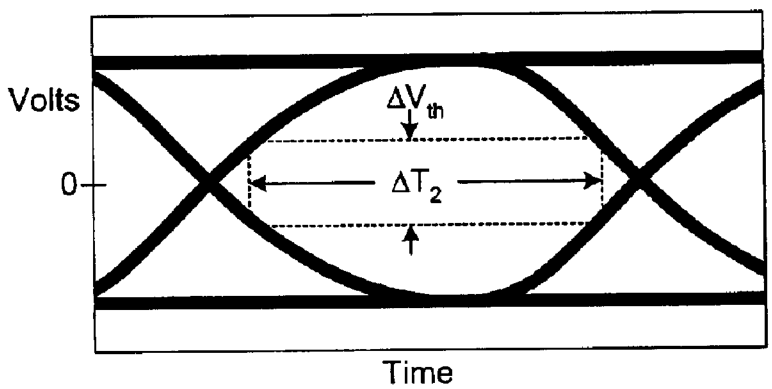
FIG. 12 depicts a fully open eye diagram for a differential signal.

FIG. 12 illustrates the type of received eye pattern that would be expected for relatively low-speed signaling across a differential pair. Although high-frequency attenuation noticeably affects the shape of the eye, the eye is still fully open, i.e., the voltage sensed on each trace reaches, for all practical purposes, its long-term steady-state value between signal transitions. The eye opening of FIG. 12 is slightly time-shifted, but its duration $\Delta T_2$ is not much smaller than the duration of the ideal eye opening.

Figure 13:
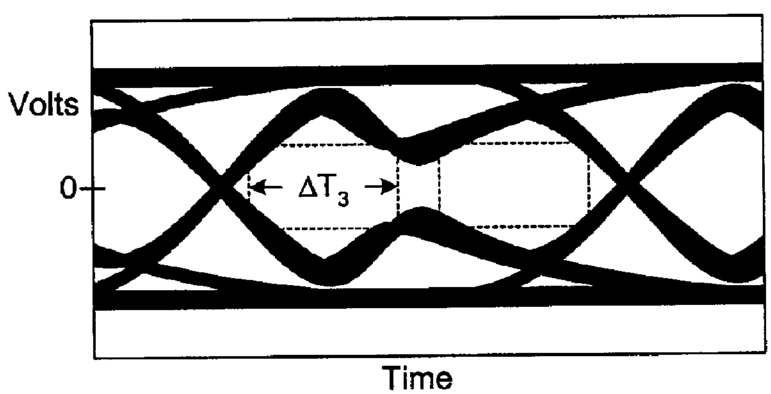
FIG. 13 depicts a non-preferred eye diagram illustrative of what might be expected with a backplane without the tailored stub capacitance of FIG. 15.

FIG. 13 illustrates the type of received eye pattern that could be expected for high-speed signaling across a differential pair with unmatched stubs at each end (similar in length to those in the described embodiments), i.e., due to reflections at the thru-holes. High-speed signaling stresses the eye pattern detector, as the eye cannot fully open between consecutive signal transitions. To compound this problem, the unmatched stubs at each end of the traces (which are coincidentally matched to each other) can place reflections on the differential pair—reflections that alternately constructively and destructively add to the transitioning signals. In some cases, a response similar to that shown in FIG. 13 has been observed, where the eye begins to open and then begins to close due to the stub reflections. In some cases, this may cause the receiver to detect two eye openings where only one should exist, or to detect none at all.

Figure 14:
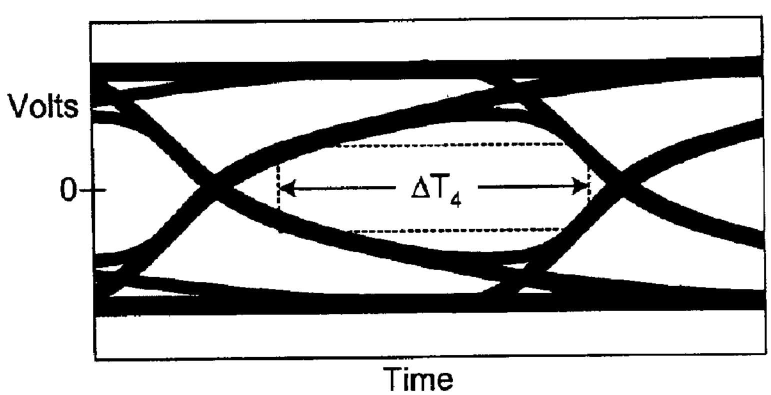
FIG. 14 plots an eye diagram typical of a router backplane operating at 3.125 GHz with signal thru-holes as shown in FIG. 15.

FIG. 14 illustrates the type of received eye pattern that could be expected for high-speed signaling across a differential pair with matched stubs according to an embodiment of the invention. By control of how reflections occur at thru-holes, a detectable eye opening response can be designed without the droop shown in FIG. 13.

Therefore, in the preferred approach to designing a backplane according to an embodiment of the invention, the transfer functions of the thru-holes and traces are considered together in order to compensate for signal reflections at the thru-hole stubs. Considering a transmit signal $T_x[t]$ launched into one pair of thru-holes, across a differential pair, and out a pair of thru-holes at the other end, the corresponding received signal $R_x[t]$ can be described by the composite function $$R_x[t]=T_x[t]*H_i[t]*L[t]*H_0[t],$$

where $H_i[t]$ is the transfer function for the thru-holes that the signal is launched in to, $L[t]$ is the transfer function for the differential pair, and $H_o[t]$ is the transfer function for the thru-holes that the signal is launched back out of. These transfer functions can take into account reflection, attenuation, mode group separation, and other known effects in order to predict the eye pattern for a given backplane configuration.

Figure 15A:
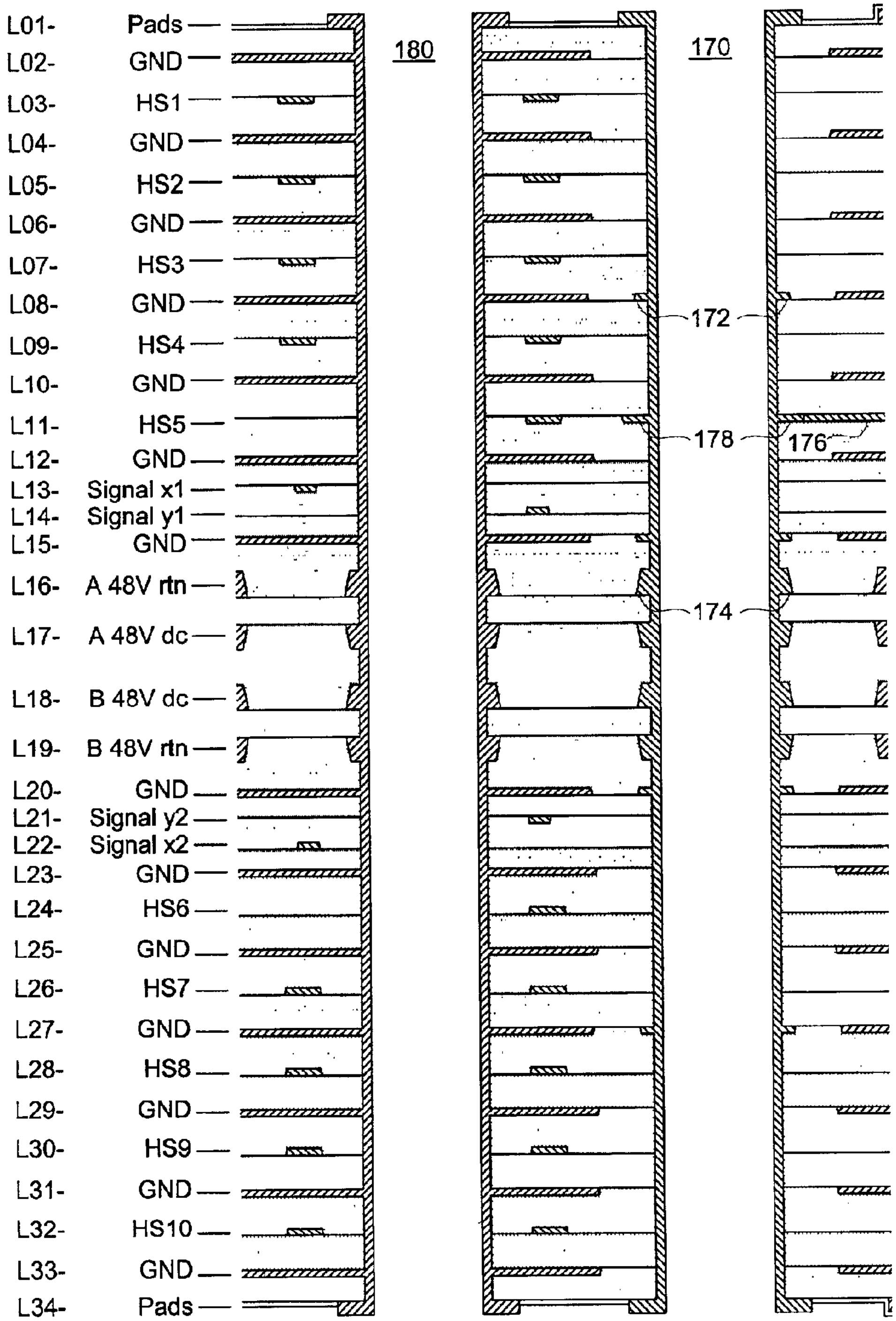
FIGS. 15*a* and 15*b* each illustrate a signal thru-hole and a ground hole in cross-section for a router backplane according to two embodiments of the invention.

The preferred embodiments utilize a novel approach to stub impedance control in which the impedance characteristics of each thru-hole are tailored by adjusting the single-ended coupling between that thru-hole and the digital ground and/or power distribution layers through which the thru-hole passes. Referring to FIG. 15*a*, a signaling thru-hole 170 and adjacent digital ground thru-hole 180 are shown in cross-section. In this embodiment, thru-holes 170 and 180 have a drilled diameter of 28 to 30 mils, with a hole plating of one mil minimum. The signaling thru-hole 170 passes through holes in each ground and power plane, and thus capacitively couples to each of these planes. This capacitive coupling is preferably tailored using nonfunctional pads ("deadpads") on some planes to place added capacitance at selected locations along the thru-hole.

Although other deadpad configurations can be used in an embodiment of the invention, the disclosed pad configurations were selected based on several criteria. First, any added deadpad was given the minimum diameter that could be hit during drilling without a high probability of the drill bit missing the pad on one side. This allowed for the pads and their clearances to stay a reasonable size, and allowed more pads to be added. Second, the pads were distributed approximately every 25% of the board, to relieve board stress and distribute capacitance at even intervals. Third, in the hybrid board design, each power distribution layer received a deadpad, since those layers were thick and near the center of the board (the different fabrication method and longer thru-hole barrel length of the single-material embodiments allowed the power layer deadpads to be taken out). Fourth, the clearances were increases on the power distribution layers since those pads were thicker and therefore had a larger area for forming a capacitor.

With the material stack shown in FIG. 15*a*, a prior art signaling thru-hole without deadpads would have a capacitance of about 1.2 to 1.4 pF. Signaling thru-hole 170, as shown, has a capacitance of about 1.6 to 2.0 pF. When matched with the differential trace geometry shown in FIG. 10, this signaling thru-hole with added capacitance (and a small amount of added inductance) can substantially eliminate high-speed signaling droop such as shown in the eye pattern of FIG. 13.

Figure 16:
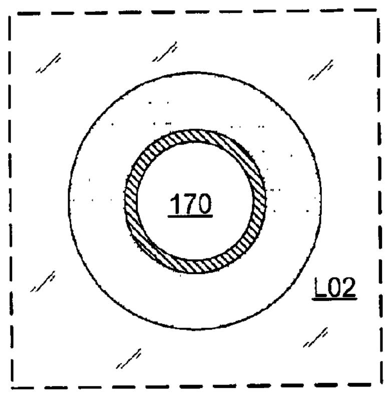
FIGS. 16–19 illustrate various pad and clearance configurations useful with the signal thru-hole of FIGS. 15*a* and 15*b;*
Figure 17:
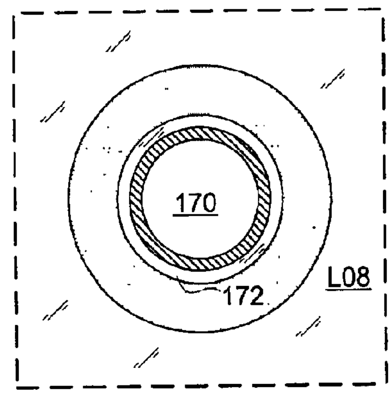
Figure 18:
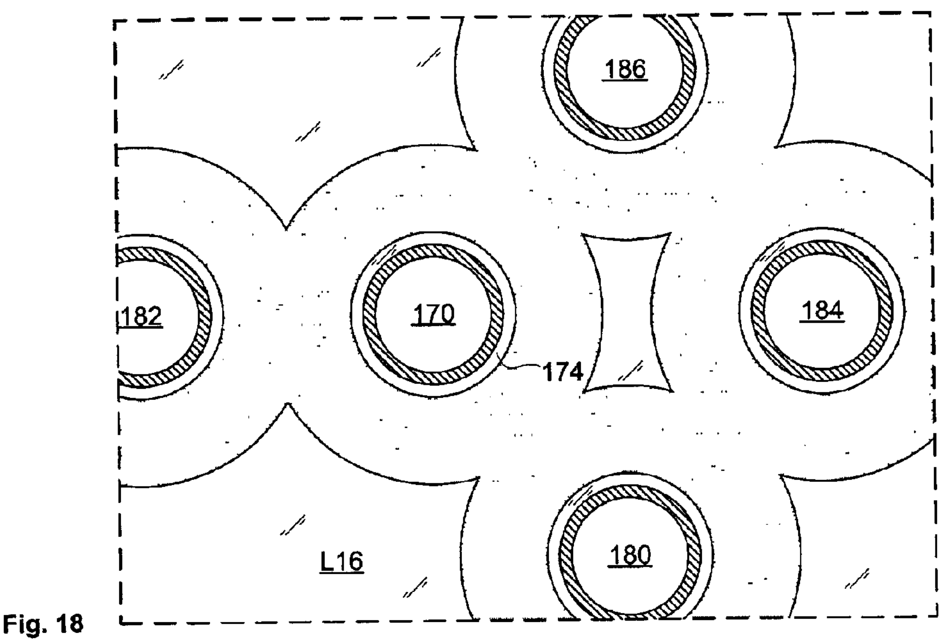
Figure 19:
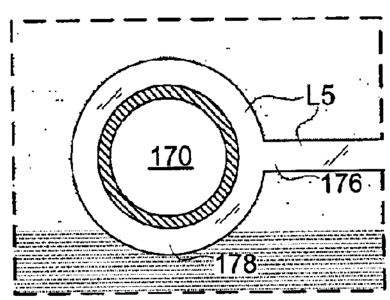

Signaling thru-hole 170 is designed to have a specific capacitive coupling characteristic with the ground and power distribution planes of the backplane. On most ground planes, such as those of layers L02 and L04, thru-hole 170 passes through a 52-mil diameter clearance (see FIG. 16 for a cutaway top view of layer L02 at thru-hole 170). On the ground planes at layers L08, L15, L20, and L27, thru-hole 170 passes through a 34-mil diameter pad 172 (L08) centered in a 54-mil diameter clearance (see FIG. 17 for a cutaway top view of layer L08 at thru-hole 170, showing pad 172). On the thick power distribution planes at layers L16, L17, L18, and L19, thru-hole 170 passes through a 34-mil diameter pad 174 centered in a 70-mil diameter clearance (see FIG. 18 for a cutaway top view of layer L16 at thru-hole 170, showing pad 174). Note that on the power distribution planes the clearances for many neighboring thru-holes merge (e.g., 170 and 182, 184, and 186), as the distance between the holes is less than twice the specified clearance. FIG. 19 shows a cutaway view of high-speed layer HS5 (layer L11), illustrating the functional pad 178 connected to trace 176 at that layer.

Figure 15B:
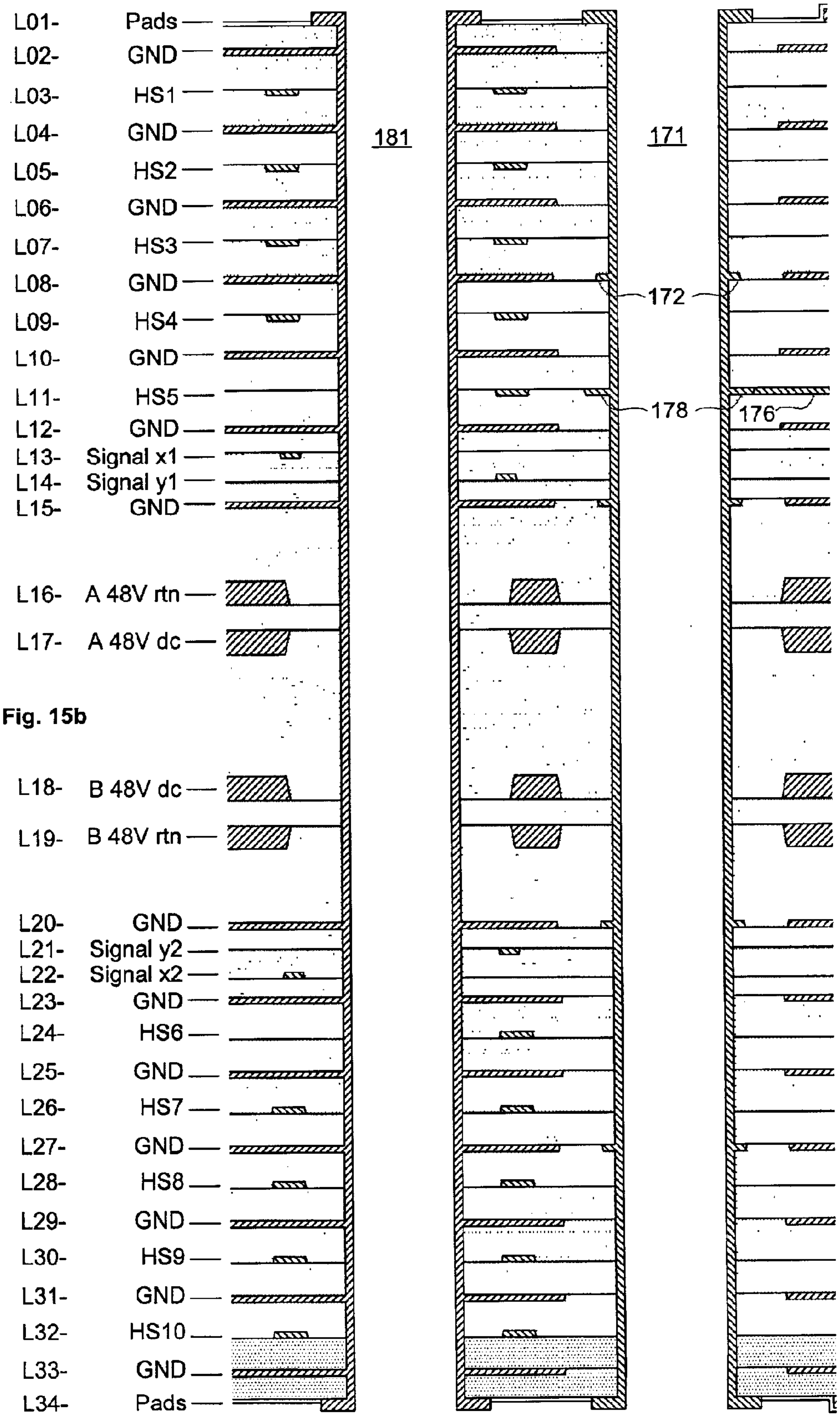

FIG. 15*b* is similar to FIG. 15*a*, but shows a cross-section for a single-dielectric-material embodiment. Most notably, no deadpads are used on the power distribution layers, and the signal throughhole 171 passes through a 52-mil clearance on those layers.

4.3.3 One Layer Per Switch Fabric Card

Figure 20:
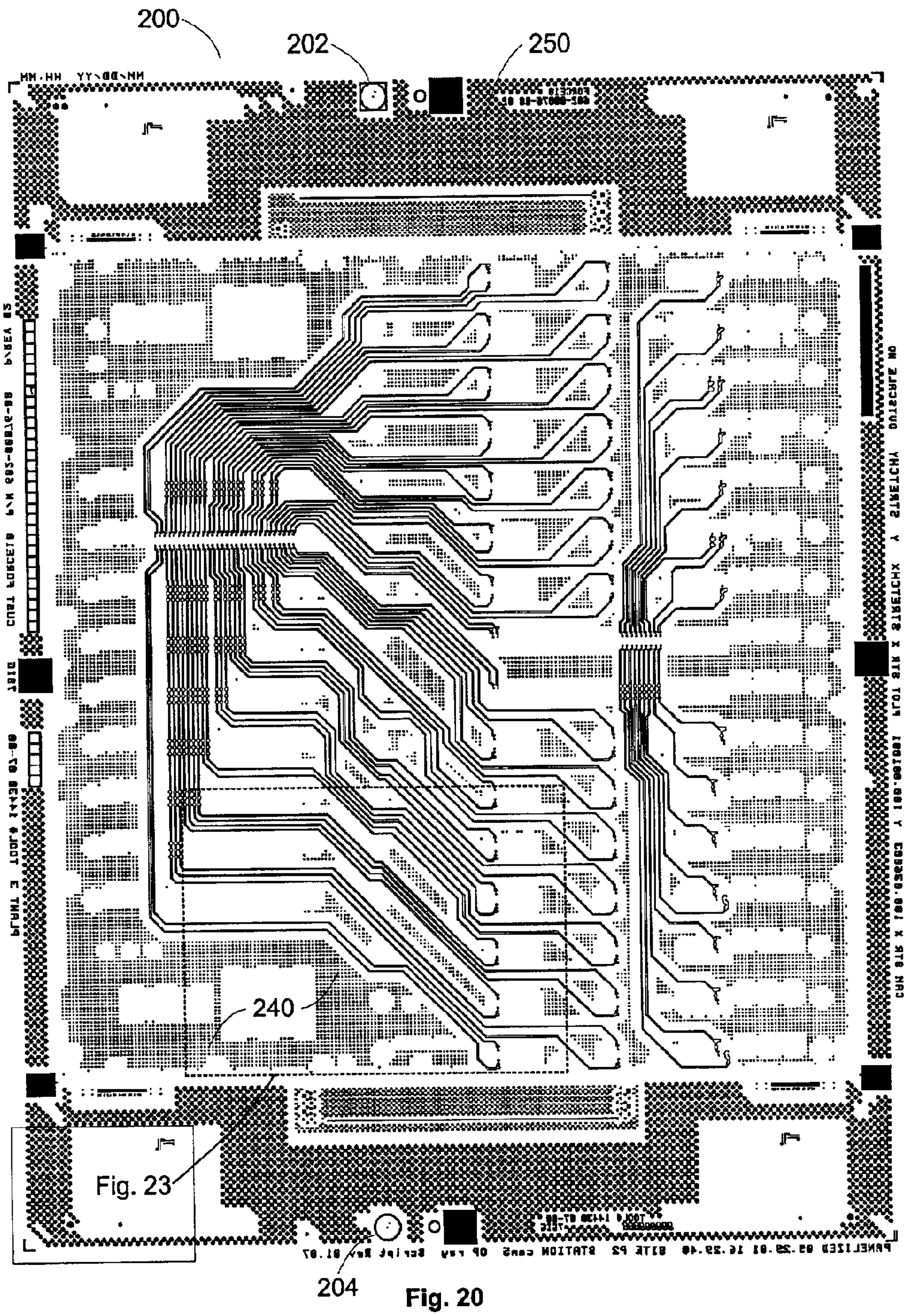
FIG. 20 shows the panel mask for a high-speed signaling layer in a router backplane.

One goal of the preferred backplane designs is to design differential signal paths with known and controllable impedance. To this end, the high-speed signaling differential pairs are each designed to run between their card connectors on a single plane, with no layer-swapping vias. In order to allow an efficient routing solution with no layer-swapping, nine of the high-speed layers are each dedicated to signaling to and from a single switch fabric card. For example, FIG. 20 illustrates the panel mask for layer L07 (high-speed signaling layer HS3), which connects switch fabric card SF1 (FIG. 3) to each of the line cards. It can be appreciated that the resulting layout allows for differential pair routing that is largely direct and short. The tenth high-speed layer is used for short-reach signaling to several switch fabric cards, as will be explained next.

4.3.4 Selection of a High-Speed Layer for Signal Routing

Not only have the differential pairs been arranged for efficient routing, but the selection of which high-speed layer(s) will be used for each switch fabric card also improves performance. Generally, the lower high-speed layers have been designed to carry the very longest high-speed traces, and the longest traces have been avoided on the upper high-speed layers.

Figure 21:
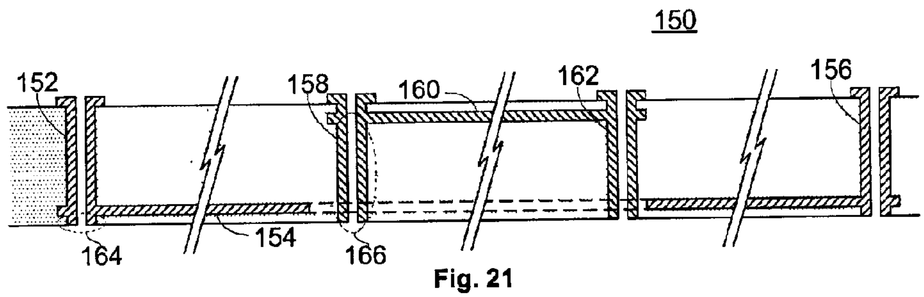
FIG. 21 illustrates a partial cross-section of a router backplane, illustrating how shorter differential pairs connect at shallower signal layers and longer differential pairs connect at deeper signal layers.

Referring to FIG. 21, a simplified cross-section of a backplane 150 is illustrated. Cross-section 150 shows a first trace 154 and a second trace 160. First trace 154 is located on a lower high-speed layer, and connects to two thru-holes 152 and 156. Second trace 160 is located on an upper high-speed layer, and connects to two thru-holes 158 and 162. A signal launched into thru-hole 152 travels down trace 154, but also travels down the remainder of thru-hole 152, which forms a stub 164 that reflects the signal back in the other direction. Likewise, a signal launched into thru-hole 158 travels down trace 160, but also travels down the remainder of thru-hole 158, which forms a much longer stub 166 that reflects the signal back in the other direction. Similar reflections occur at the exit ends of traces 154 and 160.

Longer stub 166 produces a much more problematic reflection than shorter stub 164. One way that this tendency is compensated for in the preferred embodiments is by routing shorter traces on the upper high-speed layers (where the reflections are more significant but the signal is not as degraded due to a long propagation path) and routing longer traces on the lower high-speed layers (where the reflections are less significant and thus longer path lengths, with more attenuation, can be tolerated).

In conjunction with the goal of dividing traces by dedicating high-speed layers to switch fabric cards, the preferred embodiments use at least two techniques to select routing layers. First, the topmost layer—with the longest stubs—is not dedicated to a single switch fabric card, as this would require some longer traces to reach the outboard line cards. Instead, HS1 serves a group of connections that are fairly short because these line cards are substantially vertically aligned with the corresponding switch fabric cards. Some connections meeting this criteria, and thus selected for HS1, are: line cards LC11, LC12, and LC13 to switch fabric card SF8; line cards LC9 and LC10 to switch fabric card SF7; and line cards LC7 and LC8 to switch fabric card SF6.

A second technique for reducing trace length on the upper layers is to select line card connector pins in a manner that results in shorter lengths for the upper layers. For instance, looking at FIGS. 3 and 20 in conjunction, it can be appreciated that the traces connecting SF1 to the line cards do not use the upper set of connector blocks (JLC4A and its counterparts for the other cards), but use the lower pins of JLC4C and the pins of JLC4B, and their counterparts. This reduces the maximum trace length on layers HS2, HS3, and HS4 by several inches. Starting with layer HS5, pins in JLC4A and its counterparts are used, starting from the bottom. FIG. 4 shows typical pinouts for HS9. Thus although all high-speed layers contain some short traces, those with the very longest traces are those with the shortest via stubs. Looked at strictly from a trace length standpoint this is counterintuitive, since inserting the longest horizontal trace signals to and extracting them from the bottommost high-speed layer adds even more length—almost two-thirds of an inch in the described embodiments—to those signal paths as compared to a comparable path on the topmost layer.

4.3.5 Low-Speed Signal Distribution

Some backplane signaling does not operate at high switching speeds. The preferred embodiments designate a number of layers for use with such signals. Typically, these signals are single-ended signals for party buses, clock distribution, etc. In FIG. 8, layers L13 (Signal x1), L14 (Signal y1), L21 (Signal y2), and L22 (Signal x2) are used for low-speed signaling. Note that L13 and L14, as well as L21 and L22, do not have a ground plane interposed between them. These low-speed signaling layer pairs are, however, separated from adjacent high-speed layers by a digital ground plane. The low-speed signaling layer pairs are also separated from the power distribution layer pairs by a digital ground plane. This arrangement, which pushes the higher-speed signaling and return ground noise—with accompanying higher levels of EMI—further from the power distribution layers, serves to further isolate power distribution from EMI.

4.4 Power Distribution and Noise Isolation

Although several aspects of the matter have been discussed previously, the preferred embodiments use layer stacks that allow economical distribution of power with superior noise isolation. The preferred arrangements of layers and choice of materials allow a significant amount of noise-isolated power (some embodiments are rated at 200 amperes for each power supply) to be distributed within a common board that also serves the high-speed and low-speed signaling needs of the router.

4.4.1 Arrangement of Embedded Power Layers

The particular designs of the preferred material stacks have several advantages over previous designs. As just discussed, the buried and ground-plane-isolated power supply planes L16–L19 provide a relatively noise-free power distribution system for the router. Were the power distributed by conventional means such as bus bars, roughly twice as much power conditioning and filtering would be required on each card to achieve similar noise characteristics. By placing the power supply planes buried between two isolating ground planes L15 and L20 and keeping power supply connections relatively isolated from signaling connections, the designs shown in FIGS. 8 and 9 avoid the need for costly power distribution components.

Placing the power supply planes in such a thick material stack causes other difficulties, however. In order to keep resistance low, the power supply planes should be relatively thick, e.g., three- or four-ounce copper. The preferred dielectric materials for the high-speed layers do not fill gaps between relatively thick traces well, and therefore have been adapted herein for use in some embodiments using special processes. Furthermore, the preferred high-speed dielectric materials are generally ill-suited for use in such a thick material stack, as the stress concentrated at the locations of the thru-holes tends to cause splitting and cracking during thru-hole drilling. Two preferred approaches have been developed for dealing with these problems while allowing use of N6000 or similar dielectric material on the high-speed signaling planes.

4.4.2 Hybrid Lamination Design

In the approach shown in FIG. 8, the use of low-speed FR4 material on all layers between L12 and L23 allows the thick material stack with buried power distribution planes to be fabricated without creating voids. In one preferred embodiment, two 1080 N4000-6 glass sheets with a resin content of 57.5% are used on each side of each low-speed signaling layer; for the power distribution layers, 1080 N4000-6 sheets with a higher resin content (63.5%) are used to enhance gap filling. Two core sheets are used between each power distribution supply and return plane pair. Three b-stage sheets are used between each power distribution return plane and the neighboring digital ground plane. And four b-stage sheets are used between the adjacent supply planes. In this embodiment, the interface between N6000 and FR4 occurs at ground planes (L12 and L23), such that copper largely separates the two dielectric materials and good bonding is achieved.

The via-capacitance-tailoring pads used on layers L15 through L20 serve a second purpose in that they aid the manufacturability of the board. Stress at the high-speed connector vias, as well as the size of the voids that must be filled during booking, are lessened by the use of deadpads on the power distribution planes and adjacent digital ground planes.

This material stack has an added advantage for noise rejection. Note that because FR4 has higher losses for high frequency signals than N6000, the use of FR4 near the power distribution planes provides an additional measure of high frequency noise rejection between the power supply and low-speed signaling layers.

4.4.3 Pure N6000 Lamination Design

A second fabrication approach can produce a material stack such as shown in FIG. 9. This material stack preferably uses N6000-21 material exclusively, for high-speed, low-speed, and power distribution. The resin contents are modified near the center of the board to enhance void-filling as follows: two sheets of 3313, 50.6% resin content N6000-21 glass form all cores in the board except for the cores between L16 and L17, and between L18 and L19, where two sheets of 1080, 60.3% resin content N6000-21 glass are used. Each of the two patterned power cores is sandwiched between two b-stage sheets of 3313, 53.4% resin content and one b-stage sheet of 1080, 65% resin content N6000-21 glass per side in a first booking designed to fill the deep voids in the patterned four-ounce copper planes. An additional four sheets of 1080, 60.3% resin content b-stage material are placed between layers L17 and L18 prior to final booking, with three such layers placed between L15 and L16, and between L19 and L20. Two sheets of b-stage 1080, 60.3% resin content are also placed between L01 and L02, between L13 and L14, between L21 and L22, and between L33 and L34. Like the hybrid design, b-stage material for the high-speed layers consists of two 50.6% resin content 3313 N6000-21 glass sheets.

An advantage of the pure N6000 design over the hybrid design is that it resolves any dielectric-compatibility issue that may exist with the hybrid design.

5 Fabrication of a High-Speed, High Layer Count Backplane

Preferred methods for assembling the layers of a backplane will now be described. A process for single-material, multiple-lamination-cycle fabrication will be described first in its entirety. A process for single-lamination-cycle, hybrid-material fabrication then will be described where it differs from the first process.

5.1 Single Material/Multiple Lamination Cycle Design

One preferred method of making a backplane embodiment uses a single high-speed dielectric material throughout. To improve the manufacturability of such a design, multiple lamination cycles are used to complete a panel.

5.1.1 Core Makeup

Prior to assembly of the backplane, a first step in the fabrication of the backplane is the makeup of plated and patterned core sheets. For a high-speed layer, a preferred core sheet consists of two sheets of 50.6% resin content 3313 N6000-21, which are laminated together under laminating conditions as recommended by the manufacturer to cure them. Once bonded and cured, these two sheets form a core dielectric layer about 7.5 mils thick, with peak roughness features on the order of 0.1 mils. Although from a mode group separation viewpoint this roughness would not necessarily be desirable, the desire for a smooth conductor surface is preferably balanced by the need for good adhesion between N6000 and copper.

The core is plated with one-ounce copper on both sides. The copper on one side is patterned using an etch-compensated process to produce one of the desired layers of high-speed differential pairs; the copper on the other side is patterned using a similar process to produce the adjacent ground plane. In one preferred embodiment, ten differently-patterned copper-plated cores form the ten high-speed layers that will be assembled in the finished product, and another four differently-patterned cores form the four low-speed layers that will be assembled in the finished product.

After patterning, the patterned cores are processed through an oxide treatment process that roughens the outer surfaces of the copper plating, as well as cleans them, to enhance copper-to-b-stage adhesion during the lamination cycles. Preferably, the parameters of this process are controlled to produce a copper surface roughness similar to that found at the plating-to-core-dielectric boundary. It is believed that adjusting the top-surface and bottom-surface trace roughness to be approximately equal prevents additional mode group separation, as the current traveling along the top and bottom of the traces will incur similar delays due to surface roughness.

The two power cores are prepared in somewhat similar fashion. Two sheets of 60.3% resin content 1080 N6000-21 material are laminated together under laminating conditions as recommended by the manufacturer to cure them. Once bonded and cured, these two sheets form a core dielectric layer about 6 mils thick, with peak roughness features on the order of 0.5 mils. As the power layers do not pass high frequencies, the larger surface roughness is preferred in order to increase metal-to-dielectric adhesion.

Each power core is plated with four-ounce copper on both sides. The copper on one side is patterned using an etch-compensated process to produce one of the desired DC supply planes; the copper on the other side is patterned using a similar process to produce the corresponding DC return plane. In the preferred embodiments, two differently-patterned copper-plated cores form the two sets of power planes used in the backplane.

After patterning, the patterned power cores are processed through an oxide treatment process that roughens the outer surfaces of the copper plating to enhance copper-to-b-stage adhesion during the lamination cycles. Preferably, the parameters of this process are controlled to produce a copper surface roughness similar to that found at the plating-to-core-dielectric boundary, i.e., 0.4 to 0.5 mils for the power planes.

5.1.2 First Lamination Cycle

In the preferred dual-lamination-cycle embodiments, a first lamination cycle bonds two sheets of 3313 53.4% resin content and one sheet of 1080 65% resin content N6000-21 material, to each side of the two power cores (layers L16/17 and L18/19, respectively). This separate lamination cycle, performed with high-resin-content glass, ensures that the features in the four-ounce patterned power planes are filled with glass and void-free. The first lamination cycle is performed under laminating conditions as recommended by the manufacturer.

The 1080 material is placed on the outside layers of the subassembly. The 3313 material is rich in resin and freely gives up that resin to be pressed into etched copper areas. Unfortunately, this can leave areas on the subassembly surface without enough pressure during lamination to adhere the glass to the core. The 1080 material fills in, thus avoiding these areas of low pressure and producing a smooth, fully laminated sheet in preparation for the final lamination cycle.

5.1.3 Providing for Alignment

Panel masks conventionally contain alignment marks (see marks 202, 204 in FIGS. 7 and 20). These marks are registered in each layer such that when the material stack is built up prior to booking, the layers can be co-aligned by aligning the marks.

The dual lamination cycle presents a problem with respect to alignment. Once a conductive layer, e.g., L16, has been laminated to glass during the first lamination cycle, the alignment marks are obscured and cannot be used to align the layers in the second lamination cycle with the desired accuracy.

Figure 22A:
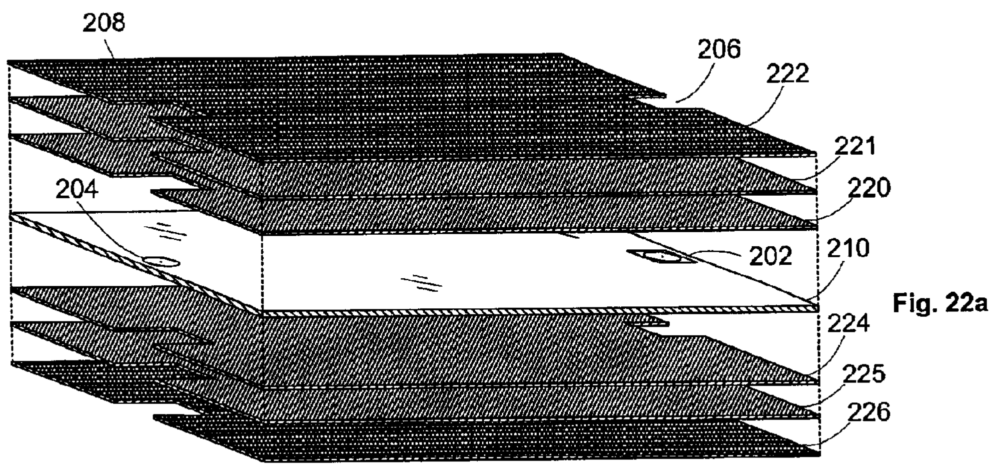
FIGS. 22*a* and 22*b* show, respectively, exploded and assembled views for the first lamination cycle of a two-lamination cycle process.
Figure 22B:
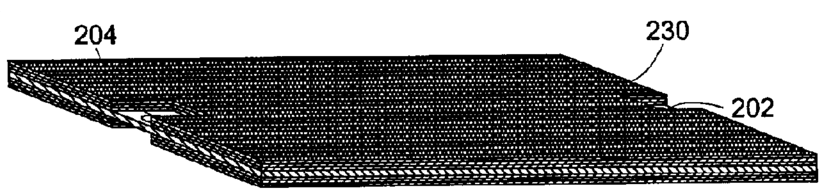

In the preferred embodiments, notching the glass sheets prior to the first lamination cycle solves this problem. As illustrated in FIG. 22*a*, a power core 210 has alignment marks 202 and 204. Six glass sheets 220, 221, 224, 225 (3313 material) and 222, 226 (1080 material) are cut to size, and then notched at locations 206, 208 where the glass sheets will overlay the alignment marks. After the first lamination cycle, glass sheets 220, 222, 224 and 226 are bonded to power core 210, but do not obscure alignment marks 202 and 204 (see FIG. 22*b*) in the intermediate assembly 230. Consequently, the second lamination cycle can rely on marks 202, 204 to properly align the intermediate assemblies with the other cores.

It is acknowledged that in the final panel assembly, either very poor fill—or no fill—may be observed at the location of notches 206, 208. The alignment marks are placed in non-critical locations, far from the board itself or any coupons such that delamination near the alignment marks is of little concern.

5.1.4 Second Lamination Cycle

The backplane panel is formed by stacking and aligning the copper-patterned cores from the different high-speed and low-speed layers with intermediate power core assemblies from the first lamination cycle, in the order depicted in FIG. 9. As shown in FIG. 9, where high-speed layers are adjacent, the ground plane of one high-speed layer faces the high-speed traces of the adjacent high-speed layer, with two sheets of 50.6% 3313 N6000-21 b-stage glass interposed. Adjacent low-speed layers are also stacked with two interposed b-stage sheets, but the material has 60.3% resin content. Between ground plane L15 and the intermediate glass layers laminated to power return L16, three sheets of 60.3% 1080 N6000-21 b-stage glass are interposed. The same arrangement is interposed between layers L19 and L20. Four such glass sheets are interposed between the two intermediate power core assemblies (between layers L17 and L18).

Once the copper-patterned cores and the b-stage sheets are stacked and aligned, the material stack is placed in a booking press. The entire stack is booked under laminating conditions as recommended by the manufacturer.

After the material stack is cooled, the thru-holes are drilled in the backplane, and the entire assembly is plated with one-ounce copper. The pads are then patterned, and a protective mask is added to complete the board. Connectors are then press-fit to the appropriate locations of the board to complete the backplane assembly.

5.1.5 Drill Cycle

Due to the thickness of the material stack and the multiple metal pads that are drilled through during via fabrication, the drill bit can become hot. This raises the probability that the glass may become hot enough to allow the bit to "spin" a deadpad or a conductive pad. Spinning a pad refers to the pad delaminating or tearing loose from the glass under drilling pressure, thereby damaging the board and possibly ruining it.

To avoid spun pads, the preferred drill cycle, and the board itself, have been designed to keep the drill bit cool. The drill is programmed to perform a "multi-peck" drill cycle for each critical via. A first peck of the drill bit penetrates the board to approximately halfway between layers L17 and L18, i.e., halfway through the board. As the nominal thickness of the dielectric between L17 and L18 is 24 mils, there is considerable margin for error in setting the depth of this peck. It is, however, believed to be important that the first peck not end right at a conductive layer, as this may cause the drill bit to grab and tear the copper pad when inserted for the second peck.

After the first peck, the drill bit is extracted from the partial via briefly, allowing heat to dissipate from the bit and the partial via. The drill bit then performs a second peck at the same location, this time penetrating through to the bottom of the board.

If the board-thickness variance from board to board or lot to lot is significant, it may not be sufficient to program the drill with a preset depth for the first peck. In such case, an unneeded portion of the panel can be sectioned and measured in order to adjust the drill depth individually for each board or lot.

5.1.6 Thieving

Very little of the plated copper on each high-speed and low-speed layer is actually needed to form the signaling traces (see, e.g., FIG. 20). On the other hand, each of these layers shares a core with a ground plane layer (see, e.g., FIG. 24) that uses a great deal of the copper originally plated on the core. Because of this disparity in copper coverage, it has been found that the patterned cores tend to curl, making them difficult to work with. Further, it has been found that during the booking process, the high-speed and low-speed traces tended to migrate slightly towards the edges of the board, resulting in misalignment in the final panel. Thieving also helps in maintaining a consistent dielectric thickness across the board, which provides a benefit of better impedance uniformity.

To combat these problems, the preferred embodiments use "thieving" in the signaling layer masks. In the present disclosure, thieving consists of a pattern, such as pattern 240 in FIG. 20, of unconnected copper mesas in areas of the board that are trace-free and via-free. Because the preferred embodiments avoid layer-swapping vias, the non-connector regions of the board are generally via-free and suitable for thieving.

Figure 23:
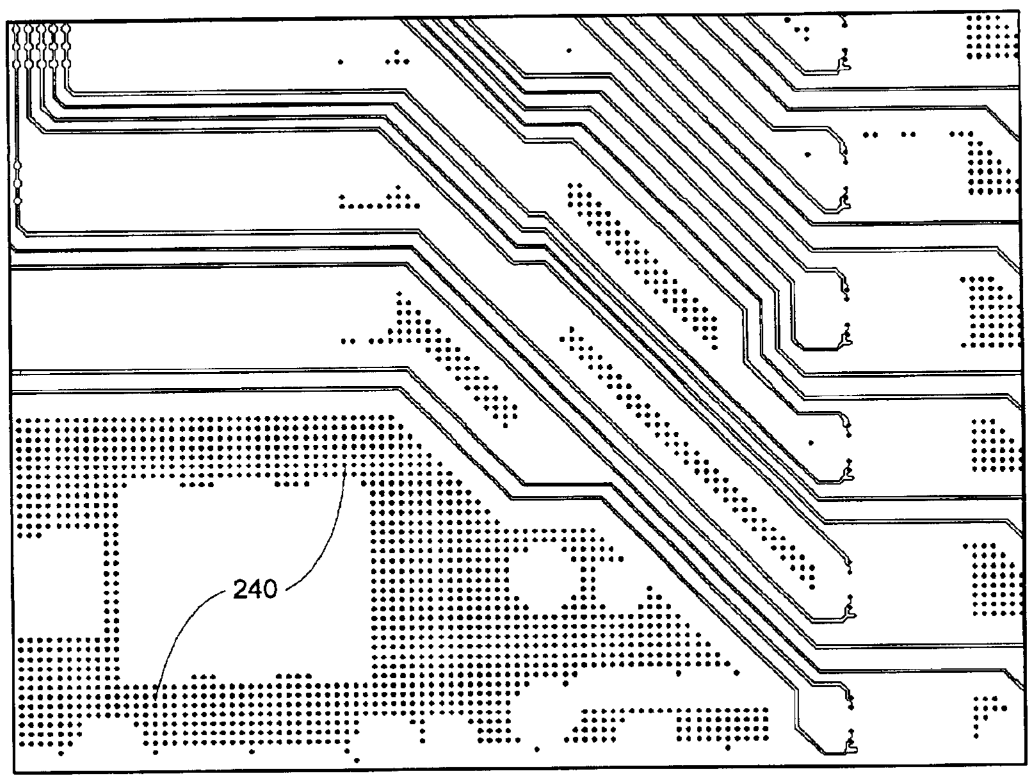
FIG. 23 contains a magnified portion of the mask of FIG. 20, illustrating thieving used in an embodiment.
Figure 25:
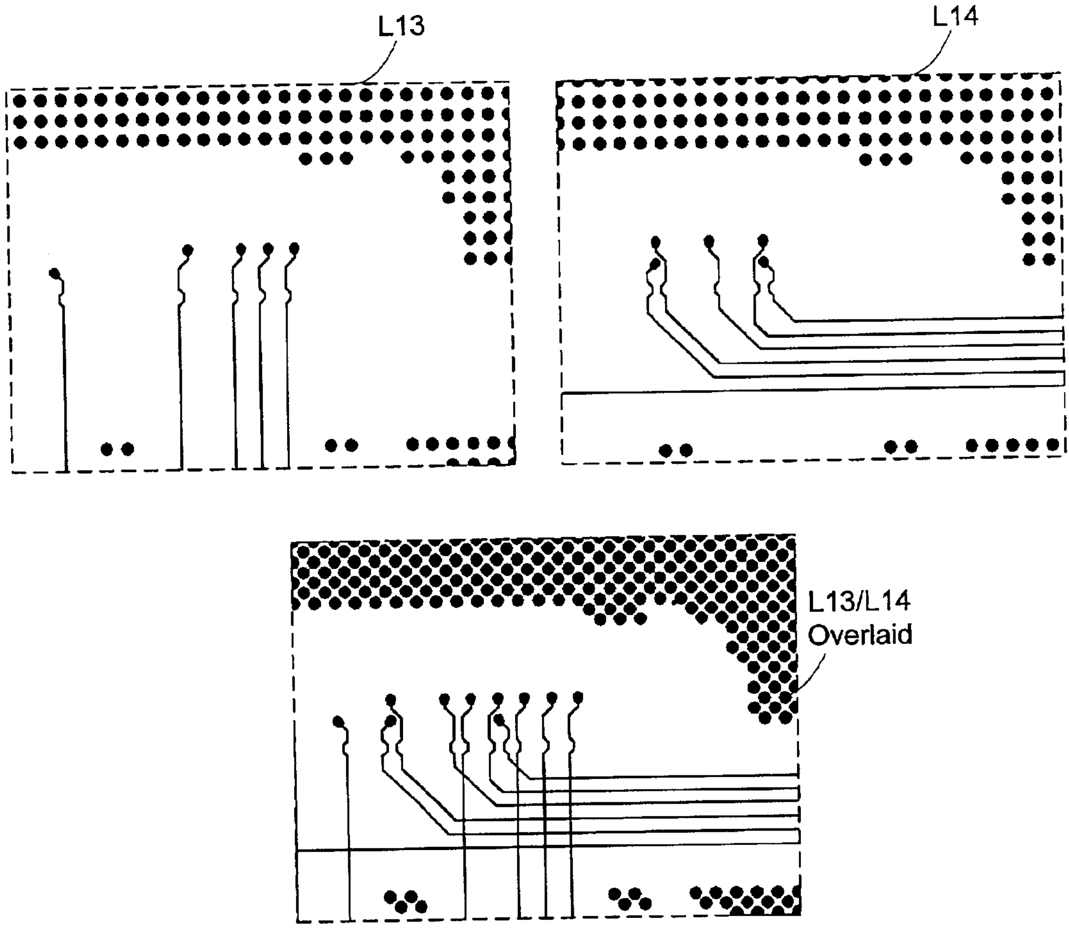
FIG. 25 illustrates thieving for two adjacent low-speed signaling layers.
Figure 26:
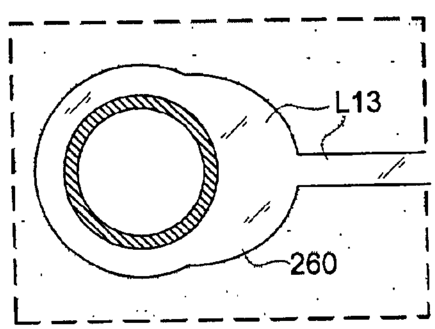
FIG. 26 illustrates a teardrop signal pad used on low-speed signaling layers.

FIG. 23 illustrates a magnified section of panel 200 from FIG. 20 in order to better illustrate the use of thieving. The thieving pattern 240 on the high-speed layers is laid out in a grid pattern. Each "dot" is a 50-mil diameter copper mesa. The dots are spaced 75 mils center-to-center in a grid pattern. On the high-speed layers, a 150-mil spacing is maintained between the thieving pattern and the closest trace or via. On the low-speed layers, a 100-mil spacing is maintained between the thieving pattern and the closest trace or via, on either the same layer or the neighboring low-speed layer. Also, for neighboring low-speed layers (the L13/L14 pair, and the L21/22 pair), the thieving pattern is interlaced in a "star-dot" pattern as shown in FIG. 25.

5.1.7 Flow Dams

On each layer, the panel outside of the board region is designed with flow dams 250 (see FIG. 20). The flow dams resist the flow of resin out the sides of the panel during booking, thereby forcing the resin to fill internal voids in the board pattern as much as possible. But the flow dams do not completely stop the flow of resin—a controlled flow keeps as much resin as possible without creating pressure at the position where the outer edge of the board will be routed from the panel. It is believed that this step reduces the chance of delamination at the outer edge of the board during routing.

5.2 Hybrid-Lamination Design

The preferred core makeups for the high-speed layers in the hybrid lamination design are identical to the core makeup described for the dual lamination cycle design. The low-speed cores and power cores are different, however. Each low-speed or power core is made of 1080 N4000-6, with a 57.5% (low-speed) or 63.5% (power) resin content. The power cores are made of two glass sheets, and the low-speed cores are made of two glass sheets.

It has been found that dual lamination cycles can be avoided with N4000-6 as that material flows and reflows much easier than N6000-21. Thus once the cores have been roughened as described for the dual lamination cycle design, all cores are stacked for booking. B-stage glass sheets for the high-speed cores are identical to the sheets described for the dual lamination cycle. Two glass sheets of 57.5% 1080 N4000-6 are placed between adjacent low-speed cores. Three glass sheets of 63.5% 1080 N4000-6 are placed between the adjacent low-speed and power cores. And four sheets of 63.5% 1080 N4000-6 are placed between the two power cores.

5.2.1 Lamination Cycle

A single lamination cycle is used to book the hybrid panel. Laminating conditions as recommended by the manufacturer are used.

5.2.2 Teardrop Pad Construction

Figure 24:
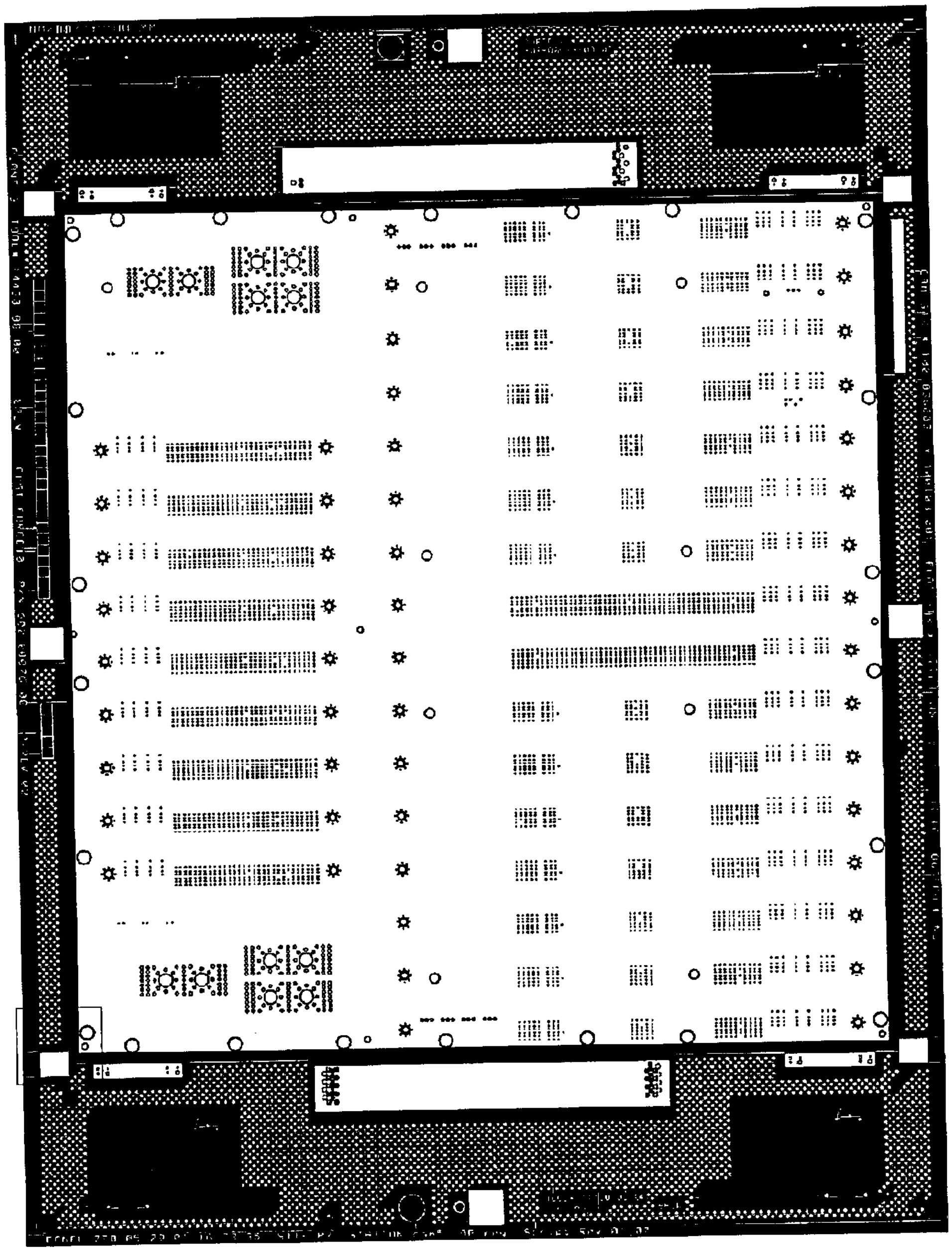
FIG. 24 shows the panel mask for a digital ground plane in a router backplane.

Like with the dual lamination cycle design, precautions have been taken with the hybrid design to greatly reduce the possibility of spun pads. It is believed that FR4 reflows much easier than N6000 due to the heat of drilling and this increases the propensity for spun pads in the FR4 portion of the material stack. Like with the dual lamination cycle design, a multi-peck drill cycle is used. But in addition, signal pads in the low-speed layers are formed as teardrop pads, i.e., each low-speed pad is augmented with a "half pad" displaced from the first pad to form a teardrop pad. The teardrop is directed towards the trace connected to the pad. FIG. 24 illustrates the construction of one teardrop pad 260.

Teardrop or oversize pads are sometimes used with lower-cost boards to compensate for poor drill tolerances. But the inventors believe this to be the first use of such pads in a design that does not need teardrop pads to compensate for a poor drill process, where during drilling the tolerance allows the via to be offset towards the end of the teardrop. This sturdier pad is simply much better at resisting spinning during drilling.

5.2.3 Drill Cycle

A multi-peck drill cycle using three separate pecks is preferred for the hybrid design. Three pecks allows the drill to cool once before entering the FR4 portion of the board, and once just after leaving the FR4 portion of the board.

The preferred endpoint for the first peck is in the dielectric layer between HS4 (layer L09) and the underlying digital ground plane at layer L10 (see FIG. 8). This endpoint is selected to ensure that any pad at layer L09 will have already been drilled through, and thus will not be spun on the second peck. Also, when the drill is inserted for the second peck, at L10 it will encounter either solid copper or an empty via space, but not a pad.

Similar considerations lead to a preferred endpoint for the second peck in the dielectric layer between Signal x2 (layer L22) and the underlying digital ground plane at layer L23.

One of ordinary skill in the art will recognize that the concepts taught herein can be tailored to a particular application in many other advantageous ways. Although specific high-speed and low-speed dielectric materials are used in the preferred embodiments, the principle of using a different dielectric material or different resin content for thicker, embedded power distribution planes can be adapted to other materials and material stacks. The material stack need not be symmetric about its center as shown in the preferred embodiments. As another example, the principle of routing differential pairs past ground thru-holes by splitting them around those holes can be adapted to connector patterns other than those used by the AMP HS3 connector geometry. Although a backplane embodiment has been disclosed, the concepts taught herein apply equally to other interconnection arrangements such as midplanes. And in other designs, the concept of allocating signal planes to individual switch fabric cards could be reversed, allocating signal planes to individual line cards.

Although the specification may refer to "an", "one", "another", or "some" embodiment(s) in several locations, this does not necessarily mean that each such reference is to the same embodiment(s), or that the feature only applies to a single embodiment.

What is claimed is:

1. A method of fabricating a multi-layer circuit board, the method comprising:

creating a first layer arrangement comprising a plurality of high-speed differential trace layers and a plurality of reference plane layers stacked in an interleaved fashion, each high-speed differential trace layer separated from each adjacent reference plane layer by a layer of a first dielectric material;

creating a second layer arrangement comprising at least four patterned power plane layers, electrically isolated from each other and form the reference plane layers, within the circuit board, each power plane layer having a thickness at least equivalent to the thickness of the three-ounces-per-square-foot-copper, stacked between layers of a second dielectric material having better void-filling capability, during lamination under similar conditions, than the first dielectric material;

creating a third layer arrangement comprising a plurality of high-speed differential trace layers and a plurality of reference plane layers stacked in an interleaved fashion, each high-speed differential trace layer separated from each adjacent reference plane layer by a layer of the first dielectric material;

stacking the first, second, and third layer arrangement in that order;

laminating the stacked layer arrangements together such that the first and second layer arrangement interface across a reference plane layer and the second and third layer arrangements interface across a reference plane layer; and forming a large plurality of plated thru-holes distributed throughout the circuit board, the plated thru-holes electrically connecting the reference plane layers, while leaving the power plane layers electrically isolated from each other and from the reference plane layers, within the circuit board.

2. The method of claim 1, wherein after laminating, the second layer arrangement is substantially at the middle of the multi-layer circuit board.

3. The method of claim 1, further comprising forming a second plurality of plated thru-holes in the circuit board, the second plurality of plated thru-holes respectively connecting the four plane layers to first power return, first power supply, second power supply, and second power return connector areas on the board surface.

4. The method of claim 1, wherein the step of creating a second layer arrangement comprises stacking the power plane layers with at least one low-speed trace layer and at least one reference plane layer separating that low-speed trace layer from the power plane layers, that low-speed trace layer and reference plane each stacked between layers of the second dielectric material.

5. A method of fabricating a multi-layer circuit board, the method comprising:

creating a first layer arrangement comprising a plurality of high-speed differential trace layers and a plurality of reference plane layers stacked in an interleaved fashion, each high-speed differential trace layer separated from each adjacent reference plane layer by a layer of a first dielectric material;

creating a second layer arrangement comprising at least two patterned power plane layers, each having a thickness at least equivalent to the thickness of three-ounces-per-square-foot copper, stacked between layers of a second dielectric material having better void-filling capability, during lamination under similar conditions, than the first dielectric material;

laminating the first and second layer arrangement together such that the first and second layer arrangement interface across a reference plane layer; and forming a large plurality of plated thru-holes distributed throughout the circuit board, the plated thru-holes electrically connecting the reference plane layers, while leaving the power plane layers electrically isolated from each other and from the reference plane layers, within the circuit board;

wherein the first dielectric material has a lower dielectric loss than the second dielectric material at high-speed frequencies.

6. The method of claim 5, wherein the first and second dielectric materials each comprise, prior to assembly, sheets of woven glass fiber impregnated with a filler, the second dielectric material having a higher percent-filler content than the first dielectric material.

7. The method of claim 6, wherein two sheets of the first dielectric material separate each high-speed differential trace layer from each adjacent reference plane layer.

8. A method of fabricating a multi-layer circuit board, the method comprising:

creating a layer arrangement comprising a plurality of high-speed differential trace layers and a plurality of reference plane layers stacked in an interleaved fashion, each high-speed differential trace layer separated from each adjacent reference plane layer by a layer of a first dielectric material;

creating a second layer arrangement comprising at least two patterned power plane layers, each having a thickness at least equivalent to the thickness of three-ounces-per-square-foot copper, stacked between layers of a second dielectric material having better void-filling capability, during lamination under similar conditions, than the first dielectric material;

laminating the first and second layer arrangements together such that the first and second layer arrangements interface across a reference plane layer; and forming a large plurality of plated thru-holes distributed throughout the circuit board, the plated thru-holes electrically connecting the reference plane layers, while leaving the power layers electrically isolated from each other and from the reference plane layers, within the circuit board;

wherein the high-speed differential trace layers each comprise a board region within a larger panel region, the panel region comprising a spaced-apart pattern of relatively small flow-impending features near its periphery.

9. The method of claim 8, wherein the power plane layers comprise approximately the same board and panel regions as the high-speed differential trace layers, the panel region of each power plane layer comprising a substantially solid peripheral plane region having a relatively few patterned channels leading from the board region toward the edges of the panel.

10. A method of fabricating a multi-layer circuit board, the method comprising:

creating a first layer arrangement comprising a plurality of high-speed differential trace layers and a plurality of reference plane layers stacked in an interleaved fashion, each high-speed differential trace layer separated from each adjacent reference plane layer by a layer of a first dielectric material comprising an allylated polyphenylene ether;

creating a second layer arrangement comprising at least two patterned power plane layers, each having a thickness at least equivalent to the thickness of the three-ounces-per-square-foot copper, stacked between layers of a second dielectric material having better void-filling capability, during lamination under similar conditions, than the first electric material, the second dielectric material comprising an FR-4 resin;

laminating the first and second layer arrangement together such that the first and second layer arrangements interface across a reference plane layer; and forming a large plurality of plated thru-holes distributed throughout the circuit board, the plated thru-holes electrically connecting the reference plane layers, while leaving the power plane layers electrically isolated from each other and from the reference plane layers, within the circuit board.

* * * * *

UNITED STATES PATENT AND TRADEMARK OFFICE

CERTIFICATE OF CORRECTION

PATENT NO. : 6,941,649 B2
DATED : September 13, 2005
INVENTOR(S) : Joel Goergen

It is certified that error appears in the above-identified patent and that said Letters Patent is hereby corrected as shown below:

<u>Column 23,</u>
Line 20, delete "form" and replace with -- from --;
Line 22, delete "the" immediately after "thickness of";
Line 23, delete "-" immediately after "three-ounces-per-square-foot";
Lines 33 and 36, delete "arrangement" and replace with -- arrangements --;
Line 53, insert -- power -- immediately after "the four";

<u>Column 24,</u>
Lines 11 and 12, delete "arrangement" and replace with -- arrangements --;
Line 20, insert -- signaling -- immediately after "high-speed";
Line 32, insert -- first -- immediately after "creating a";
Line 52, insert -- plane -- immediately after "the power";
Line 58, delete "flow-impending" and insert -- flow-impeding --;

<u>Column 25,</u>
Line 10, delete "the" immediately after "thickness of";

<u>Column 26,</u>
Line 1, delete "electric" and replace with -- dielectric --;
Line 3, delete "arrangement" and replace with -- arrangements --.

Signed and Sealed this

Twenty-first Day of March, 2006

JON W. DUDAS
*Director of the United States Patent and Trademark Office*